(12) United States Patent
Frey et al.

(10) Patent No.: US 9,370,096 B2
(45) Date of Patent: Jun. 14, 2016

(54) METHOD OF MAKING CONDUCTING POLYMER NANOFIBERS

(71) Applicant: Cornell University, Ithaca, NY (US)

(72) Inventors: Margaret Frey, Ithaca, NY (US); Daehwan Cho, Ithaca, NY (US); SangGap Lee, Daejeon (KR); Chae Un Kim, Ithaca, NY (US); Nikolas Hoepker, Ithaca, NY (US); Mark W. Tate, Ithaca, NY (US); Meryem Oznur Pehlivaner Kara, Ithaca, NY (US)

(73) Assignee: Cornell University, Ithaca, NY (US)

( * ) Notice: Subject to any disclaimer, the term of this patent is extended or adjusted under 35 U.S.C. 154(b) by 178 days.

(21) Appl. No.: 13/863,548

(22) Filed: Apr. 16, 2013

(65) Prior Publication Data

US 2014/0190730 A1 Jul. 10, 2014

Related U.S. Application Data

(60) Provisional application No. 61/635,012, filed on Apr. 18, 2012.

(51) Int. Cl.
*D01D 5/04* (2006.01)
*D01D 5/06* (2006.01)
(Continued)

(52) U.S. Cl.
CPC . *H05K 1/09* (2013.01); *C08L 65/00* (2013.01); *D01D 5/0038* (2013.01); *D01D 5/0046* (2013.01); *D01F 6/44* (2013.01); *H01B 1/127* (2013.01); *H05K 1/16* (2013.01);
(Continued)

(58) Field of Classification Search
CPC ... D01D 5/003; D01D 5/0038; D01D 5/0046; D01D 5/04; D01D 5/06; D01D 5/18; D01F 1/02; D01F 1/09; D01F 1/10
USPC .......... 264/104, 129, 131, 171.1, 171.13, 264/178 F, 184, 185, 203, 205, 211, 211.1, 264/236, 464, 465, 466, 483, 484
See application file for complete search history.

(56) References Cited

U.S. PATENT DOCUMENTS 5,911,930 A * 6/1999 Kinlen et al. ............... 264/104
8,066,932 B2 11/2011 Xu
(Continued)

FOREIGN PATENT DOCUMENTS

WO 2006132470 12/2006
WO 2012081744 6/2012
(Continued)

OTHER PUBLICATIONS

Cho et al., Fabrication and characterization of conducting polyvinyl alcohol nanofibers, Materials Letters 68 (2012) 293-295. Feb. 1, 2012.
(Continued)

*Primary Examiner* — Leo B Tentoni
(74) *Attorney, Agent, or Firm* — Hodgson Russ LLP

(57) ABSTRACT

Provided are conducting polymer nanofibers, methods of making conducting polymer nanofibers, and uses thereof. The conducting polymer nanofibers can be formed by, for example, electrospinning, force spinning, and centrifugal spinning using a spinning dope. The conducting polymer nanofibers can be used in devices, such as a radiation detecting device.

10 Claims, 21 Drawing Sheets

(51) Int. Cl.
*D01D 5/18* (2006.01)
*D01F 1/02* (2006.01)
*D01F 1/09* (2006.01)
*D01F 1/10* (2006.01)
*H05K 1/09* (2006.01)
*D01D 5/00* (2006.01)
*H01B 1/12* (2006.01)
*D01F 6/44* (2006.01)
*C08L 65/00* (2006.01)
*H05K 1/16* (2006.01)

(52) U.S. Cl.
CPC  *C08G2261/1424* (2013.01); *C08G 2261/3223* (2013.01); *C08G 2261/51* (2013.01); *C08G 2261/94* (2013.01); *H05K 2201/0278* (2013.01); *H05K 2201/0281* (2013.01); *H05K 2201/10151* (2013.01)

(56) References Cited

U.S. PATENT DOCUMENTS

| | | | |
|---|---|---|---|
| 8,231,013 B2 | 7/2012 | Chu et al. | |
| 2004/0102614 A1* | 5/2004 | Islam et al. | 264/172.11 X |
| 2004/0241436 A1 | 12/2004 | Hsieh et al. | |
| 2006/0019096 A1 | 1/2006 | Hatton et al. | |
| 2009/0130301 A1* | 5/2009 | Bahnmuller et al. | 427/122 |
| 2009/0169996 A1* | 7/2009 | Zhamu et al. | 429/221 |
| 2010/0129450 A1* | 5/2010 | Atala et al. | 264/466 X |
| 2011/0194304 A1 | 8/2011 | Han et al. | |
| 2012/0094178 A1 | 4/2012 | Loveridge et al. | |
| 2012/0107900 A1 | 5/2012 | Greiner et al. | |
| 2012/0244333 A1 | 9/2012 | Aksay et al. | |
| 2014/0083859 A1* | 3/2014 | Baeumner et al. | 204/601 |

FOREIGN PATENT DOCUMENTS

| | | |
|---|---|---|
| WO | 2012129527 | 9/2012 |
| WO | 2013033367 | 3/2013 |

OTHER PUBLICATIONS

Agustin, Electrospun Nano-Fibers as Bioseparators: Charge Based Separation of *Escherichia coli* From Liquid Samples, Masters Thesis, Cornell University. Jan. 7, 2011.

* cited by examiner a : length of contacts (cm)
b : distance between contacts (cm)
d : film thickness (cm), d << a, b
R : resistance (Ohm)

resistivity: $\rho = R \cdot d \cdot a / b$ [$\Omega$ cm]

sheet resistance (a = b): $R_{sq}$ [$\Omega_{sq}$]

=> $\rho = R_{sq} \cdot d$ [$\Omega$ cm]

conductivity: $\sigma = 1 / \rho$ [S / cm]

METHOD OF MAKING CONDUCTING POLYMER NANOFIBERS

CROSS-REFERENCE TO RELATED APPLICATIONS

This application claims priority to U.S. provisional patent application No. 61/635,012, filed Apr. 18, 2012, the disclosure of which is incorporated herein by reference.

STATEMENT REGARDING FEDERALLY SPONSORED RESEARCH

This invention was made with government support under contract no. CBET-0852900 awarded by the National Science Foundation, M08-CR01 awarded by the National Textile Center, EEC-0117770 and EEC-0646547 awarded by the National Science Foundation through the Cornell Center for Nanoscale Systems, and ECS-0335765 awarded by the National Science Foundation. The government has certain rights in the invention.

FIELD OF THE DISCLOSURE

The instant disclosure generally relates to conducting polymer nanofibers. More particularly the disclosure relates to methods of making and using conductive nanofibers and uses of such nanofibers.

BACKGROUND OF THE DISCLOSURE

Although conductive polymers have been synthesized since the early 1960s, the relationship between morphology, chain structure, and conductivity is still relatively unknown. The electron transfer mechanism is thought to be one in which the electrons travel along the conjugated backbone through delocalized electrons. Although they possess poor processability, conductive polymers show promise in organic solar cells, organic light-emitting diodes, actuators, supercapacitors, and biosensors.

One-dimensional conducting nanomaterials are excellent candidates for highly miniaturized and ultrasensitive sensors in solution-based microfluidic devices because of their extremely high surface-to-volume ratio, surface functionality, and electrical properties to detect analysts in small quantity of samples. These conducting nanomaterials, including nanofibers and nanorods, provide a powerful platform for the direct and sensitive detection of biological and chemical analytes.

The conducting polymer PEDOT:PSS has been processed from aqueous solution to make electrical components such as flexible electrodes, electrochromic displays, and transistors by forming film coatings on diverse surfaces. Most work with regard to PEDOT:PSS has exploited thin coatings or deposits and thick film prepared by casting or electrochemical techniques, in which the fabricated fibers were very thick or processed by the multi-step processes such as dip coating.

BRIEF SUMMARY OF THE DISCLOSURE

In an aspect, the present disclosure provides a method for making a conducting polymer nanofiber or plurality of nanofibers. In an embodiment, the method comprises the steps of: a) providing a spinning dope comprising a non-conducting polymer, wherein the non-conducting polymer is present at 0.5% by weight to 8% by weight, a conducting polymer, an organic solvent, wherein the organic solvent is present at 2.5% by weight to 20% by weight, water, a non-ionic surfactant, and optionally, a cross-linking agent; and b) processing the spinning dope such that the conducting polymer nanofiber or plurality of conducting polymer nanofibers are formed. The spinning dope may comprise a surface-functionalizing polymer to provide a surface-functionalized conducting polymer nanofiber or surface-functionalized conducting polymer nanofibers. The conducting polymer nanofibers may be subjected to post-fiber formation processes to provide a surface-functionalized conducting polymer nanofiber or surface-functionalized conducting polymer nanofibers.

In an aspect, the present disclosure provides a conducting polymer nanofiber or a plurality of conducting polymer nanofibers. The individual nanofibers can have a conductivity of at least 0.1 S m$^{-1}$ and/or a diameter of at least 100 nanometers and/or a length of at least 100 microns. The nanofibers can be surface-functionalized conducting polymer nanofibers.

In an aspect, the present disclosure provides devices comprising a conducting polymer nanofiber or a plurality of conducting polymer nanofibers. In an embodiment, the device is an ionizing radiation sensor.

In an aspect, the present disclosure provides methods of detecting ionizing radiation or an analyte. For example, in a method of detecting ionizing radiation the change in conductivity of the conducting polymer nanofiber or the plurality of conducting polymer nanofibers correlates to the total exposure of the conducting polymer nanofibers to ionizing radiation. In another example, in a method of detecting an analyte the change in conductivity of the conducting polymer nanofiber or the plurality of conducting polymer nanofibers correlates to the concentration of the analyte contacted with the conducting polymer nanofibers.

0%, No 2: 6 wt %, No 3: 3 wt %, No 4: 4 wt %, No 5: 4 wt % of polymer and 5 wt % of DMSO).

Figure 12:
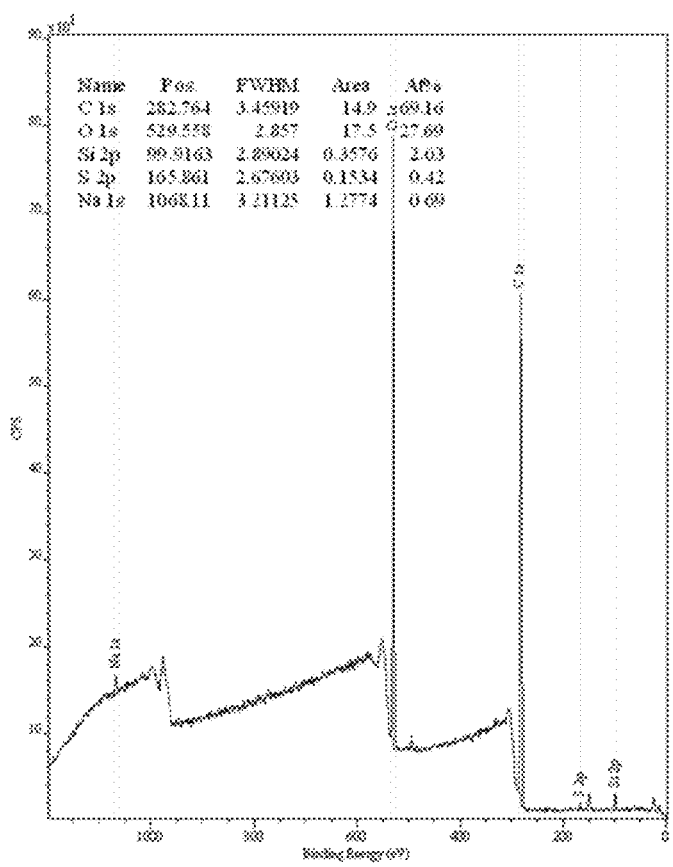

FIG. 12. Confirmation of PEDOT:PSS presence in conducting polymer nanofibers via X-Ray Photoelectron Spectroscopy (XPS).

Figure 13:
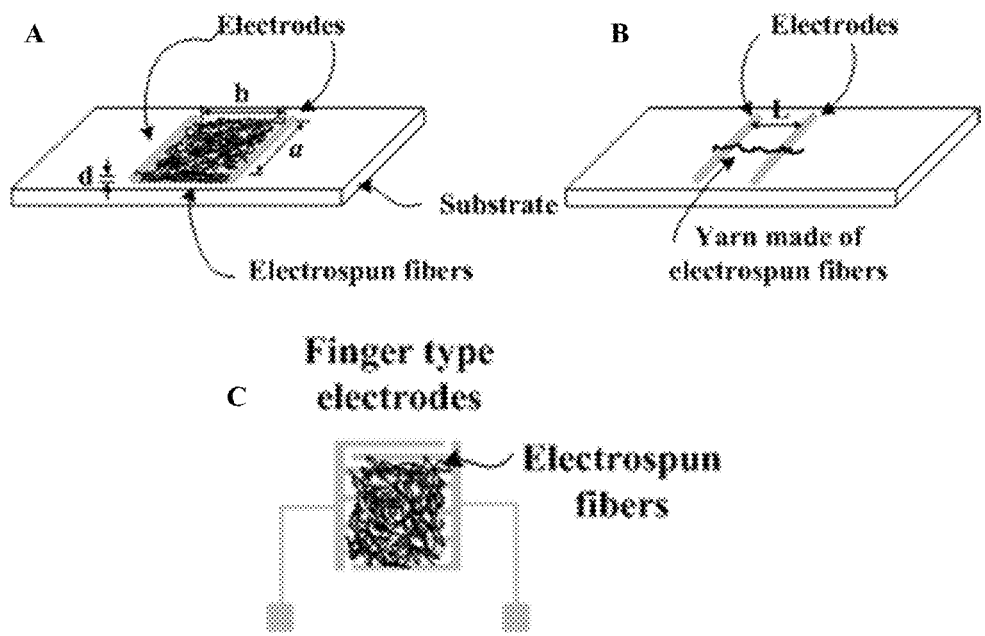

FIG. 13. Arrangements of conducting polymer nanofibers on electrodes including (a) non-woven membrane of nanofibers extending between 2 electrodes, (b) a yarn comprised of conducting polymer nanofibers extending between 2 electrodes and (c) a non-woven membrane of conducting polymer nanofibers arrayed over interdigitated finger type electrodes.

Figure 14:
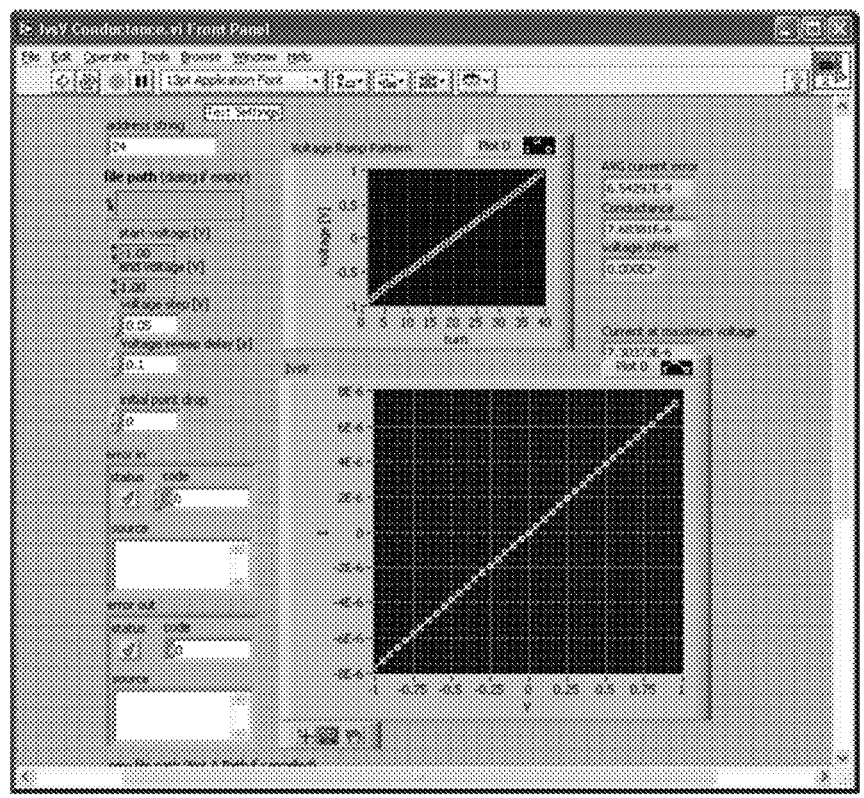

FIG. 14. Example of conductance measurement readings for conducting polymer nanofibers on electrodes.

Figure 15:
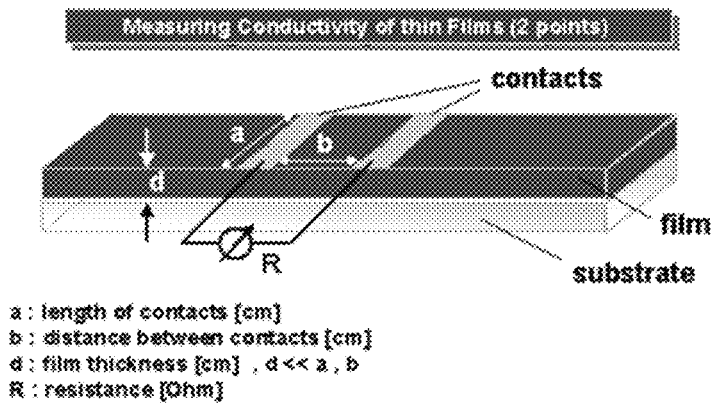

FIG. 15. Schematic and equations for determining conductivity of conducting polymer nanofiber sample from measurement readings.

Figure 16:
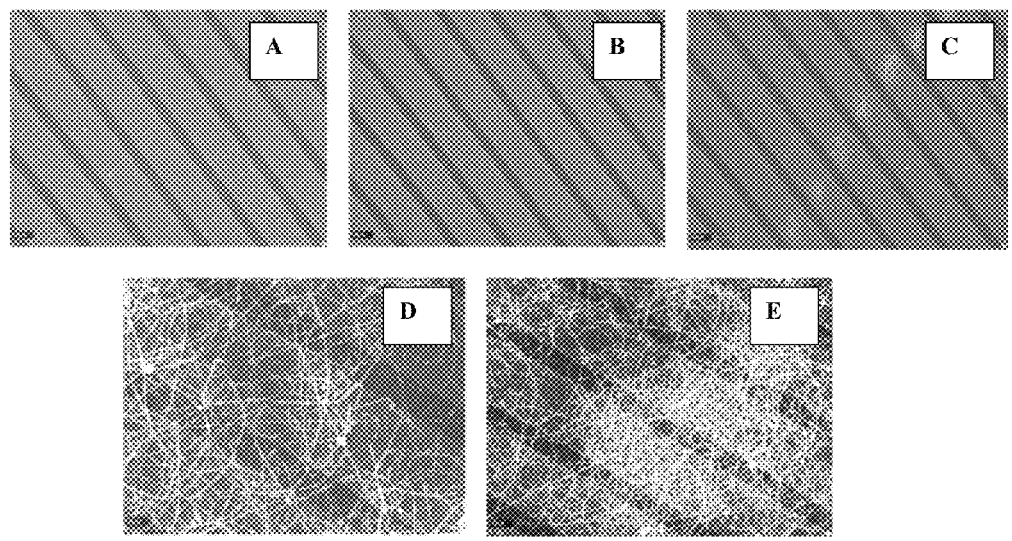

FIG. 16. Conducting polymer nanofibers collected at varying densities on interdigitated finger electrodes. Densities range from (a) single fiber across electrodes to (e) multiple fiber layers across electrodes.

Figure 17:
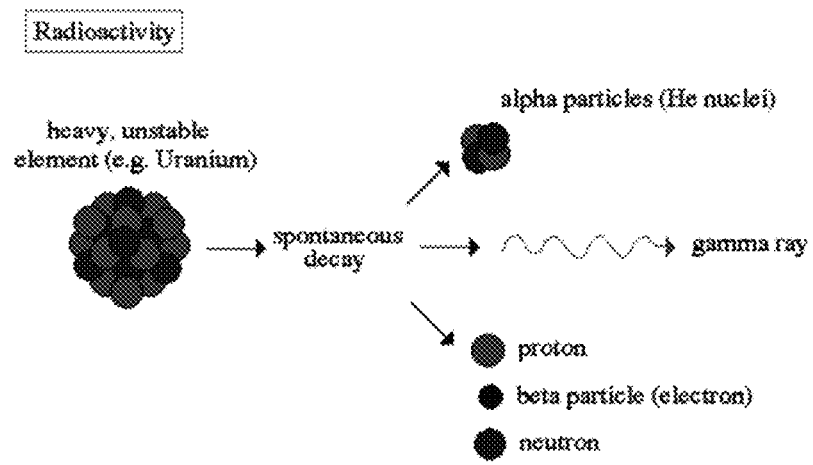

FIG. 17. Formation of gamma ray from radioactive isotopes.

Figure 18:
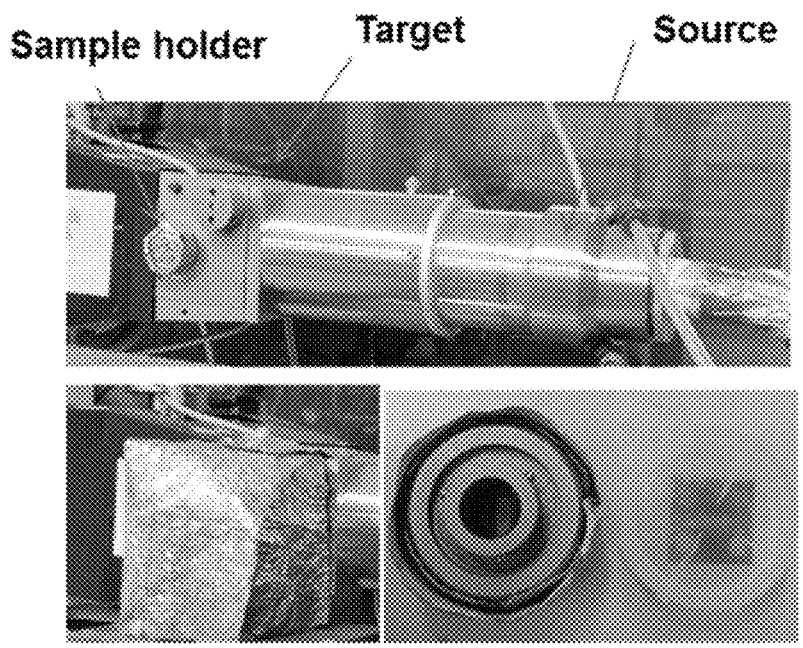

FIG. 18. Images of X-ray generating device and sample holder with conducting polymer nanofibers on interdigitated electrode chip.

Figure 19:
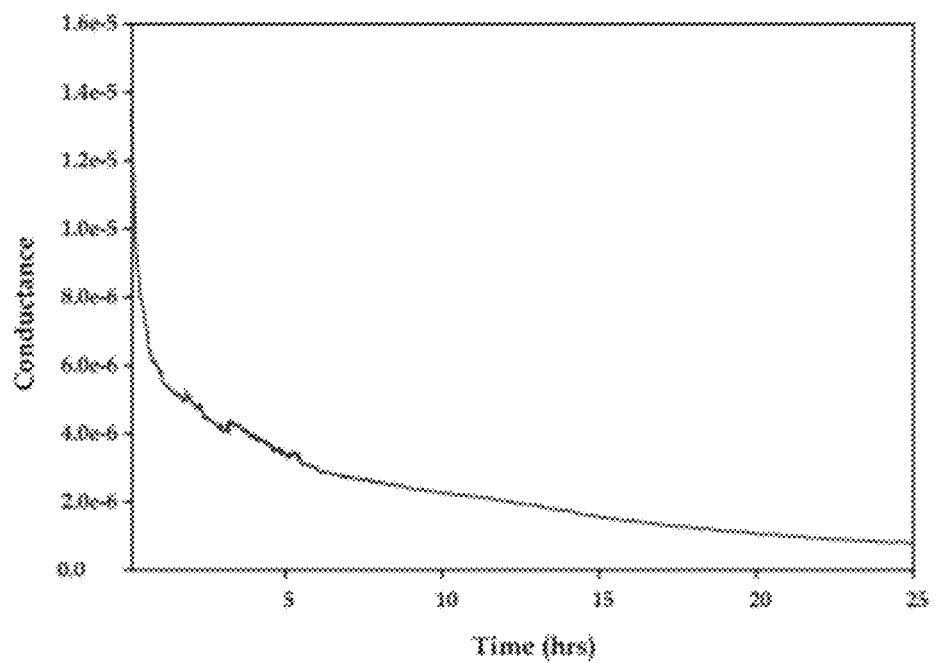

FIG. 19. Change in conductance with exposure time in X-ray generating device.

Figure 20:
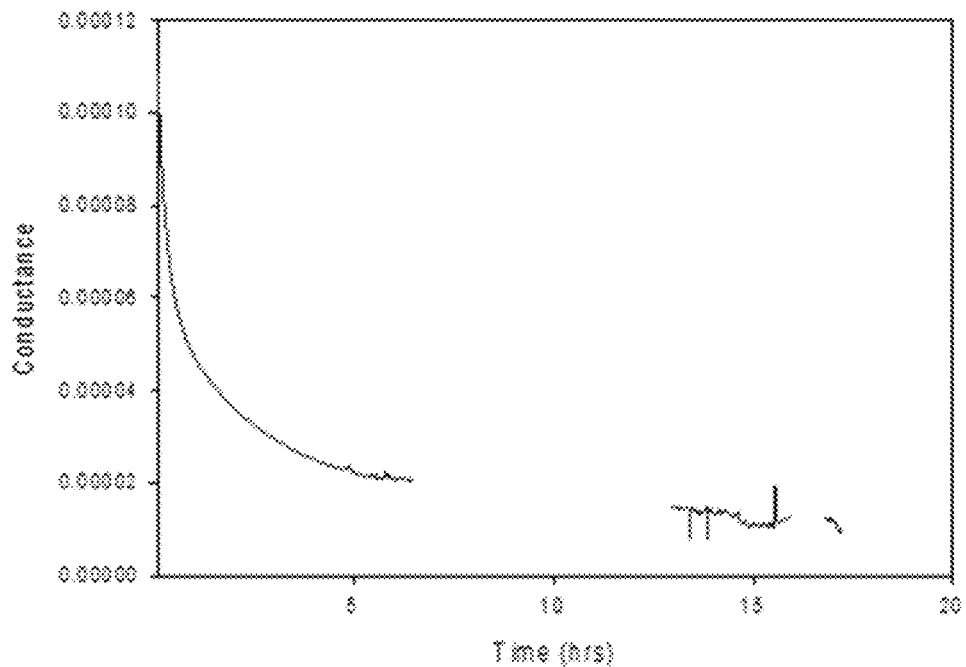

FIG. 20. Change in conductance with exposure time in X-ray generating device (reproducibility of data).

Figure 21:
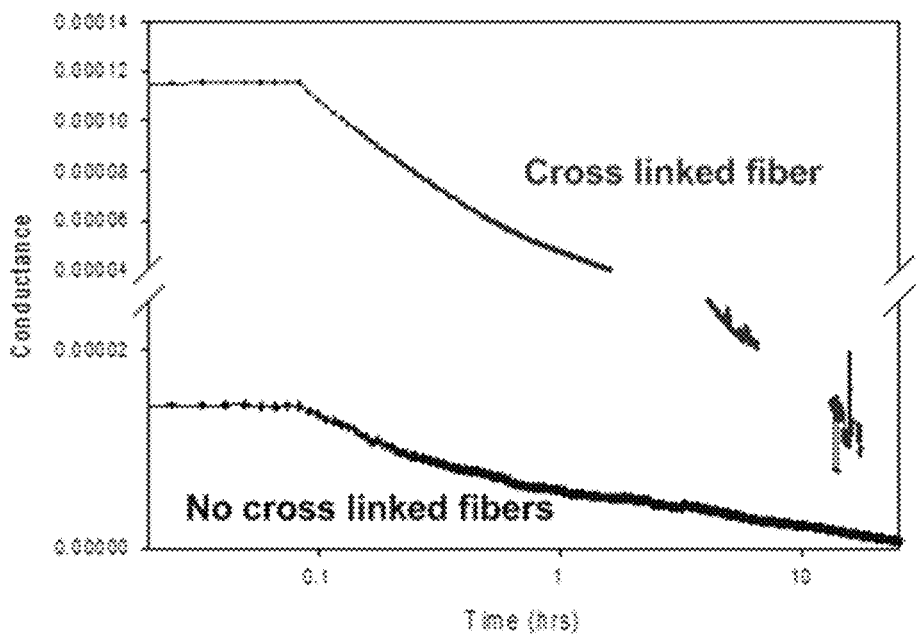

FIG. 21. Response of crosslinked and no cross linked (as spun) conducting polymer nanofibers to X-ray irradiation over time.

Figure 22:
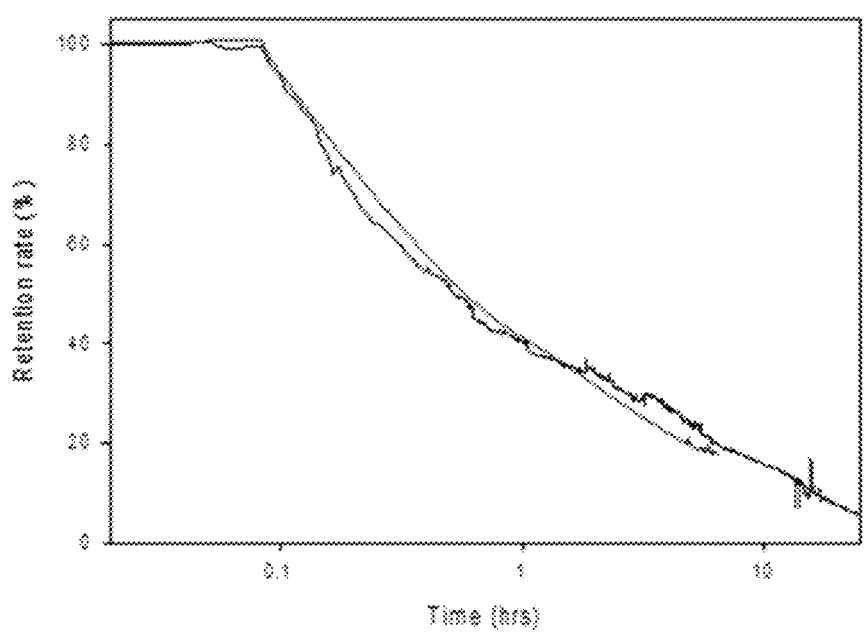

FIG. 22. Percentage of the initial conductivity retained over time of X-ray exposure for as spun and crosslinked nanofibers indicating identical response.

Figure 23:
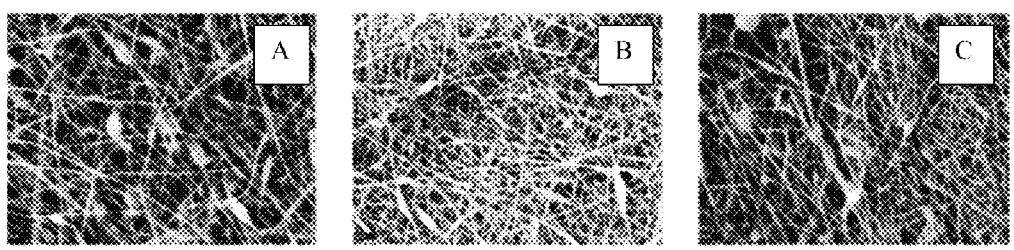

FIG. 23. No change in conducting polymer nanofiber morphology or incidence of fractured fibers was observed (a) before exposure to X-rays, (b) after 7 hours exposure to X-rays and (c) after 25 hours exposure to X-rays.

Figure 24:
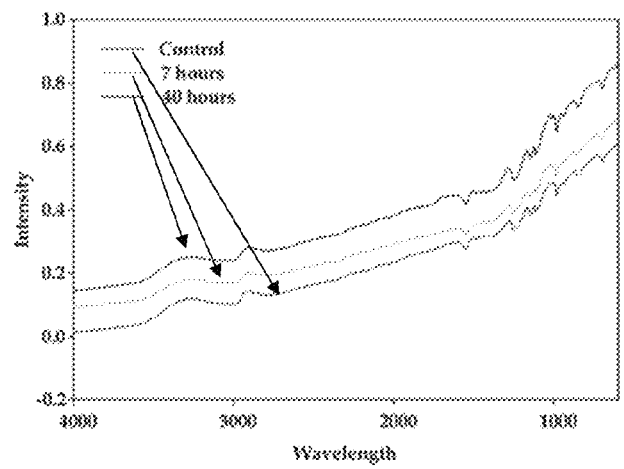

FIG. 24. Shifts in molecular structure of conducting polymer nanofibers as measured by Fourier Transform Infra-Red (FTIR) spectroscopy.

Figure 25:
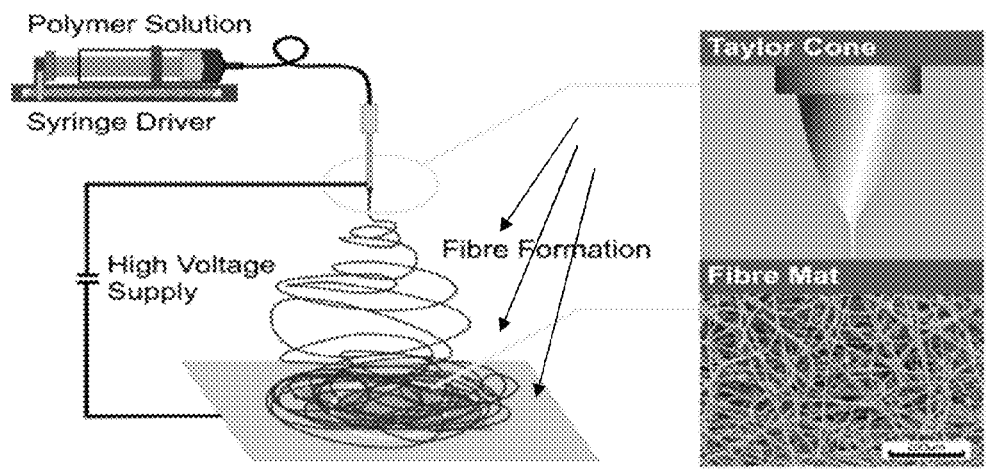

FIG. 25. Schematic depiction of the electrospinning process for formation of conducting polymer nanofibers.

Figure 26:
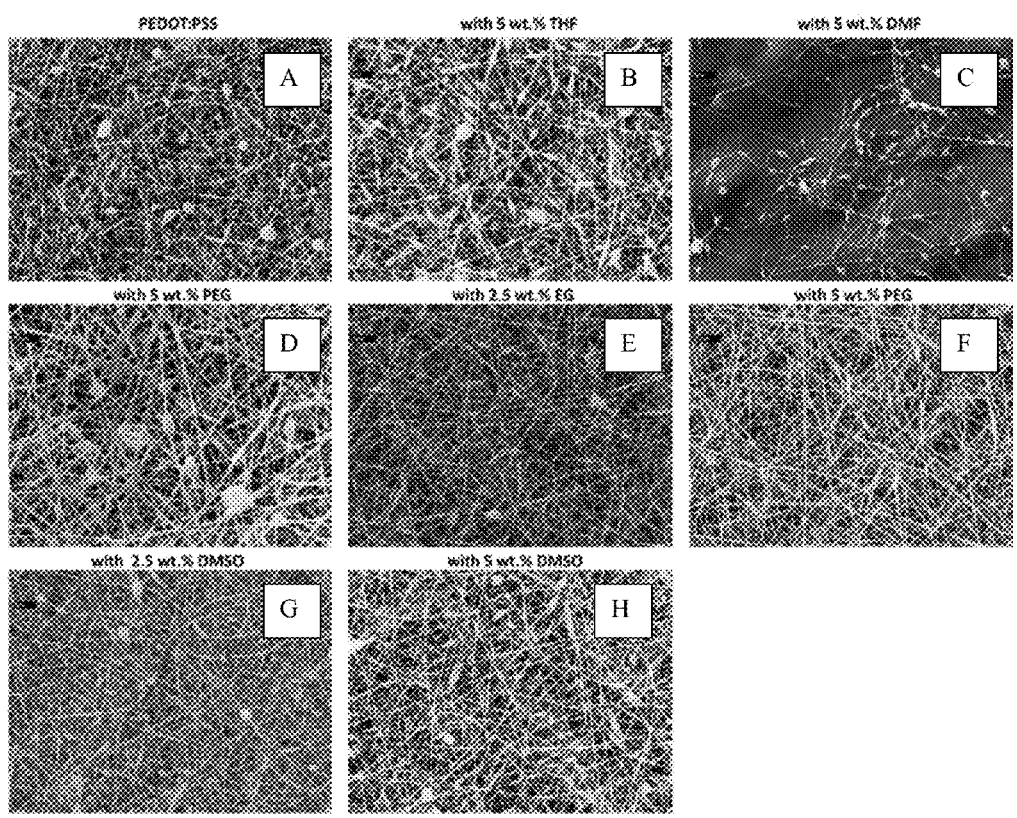

FIG. 26. Scanning Electron Microscope (SEM) images indicating effect of co-solvent addition on conducting polymer nanofiber morphology (a) conducting polymer nanofibers, (b) 5 wt % tetrahydrofuran (THF) added to spinning dope, (c) 5 wt % dimethyl formamide (DMF) added to spinning dope, (d) 5 wt % polyethylene glycol (PEG) added to spinning dope, (e) 2.5 wt % ethylene glycol (EG) added to spinning dope, (f) 5 wt % EG added to spinning dope, (g) 2.5 wt % dimethyl sulfoxide (DMSO) added to spinning dope, (h) 5 wt % dimethyl sulfoxide (DMSO) added to spinning dope.

Figure 27:
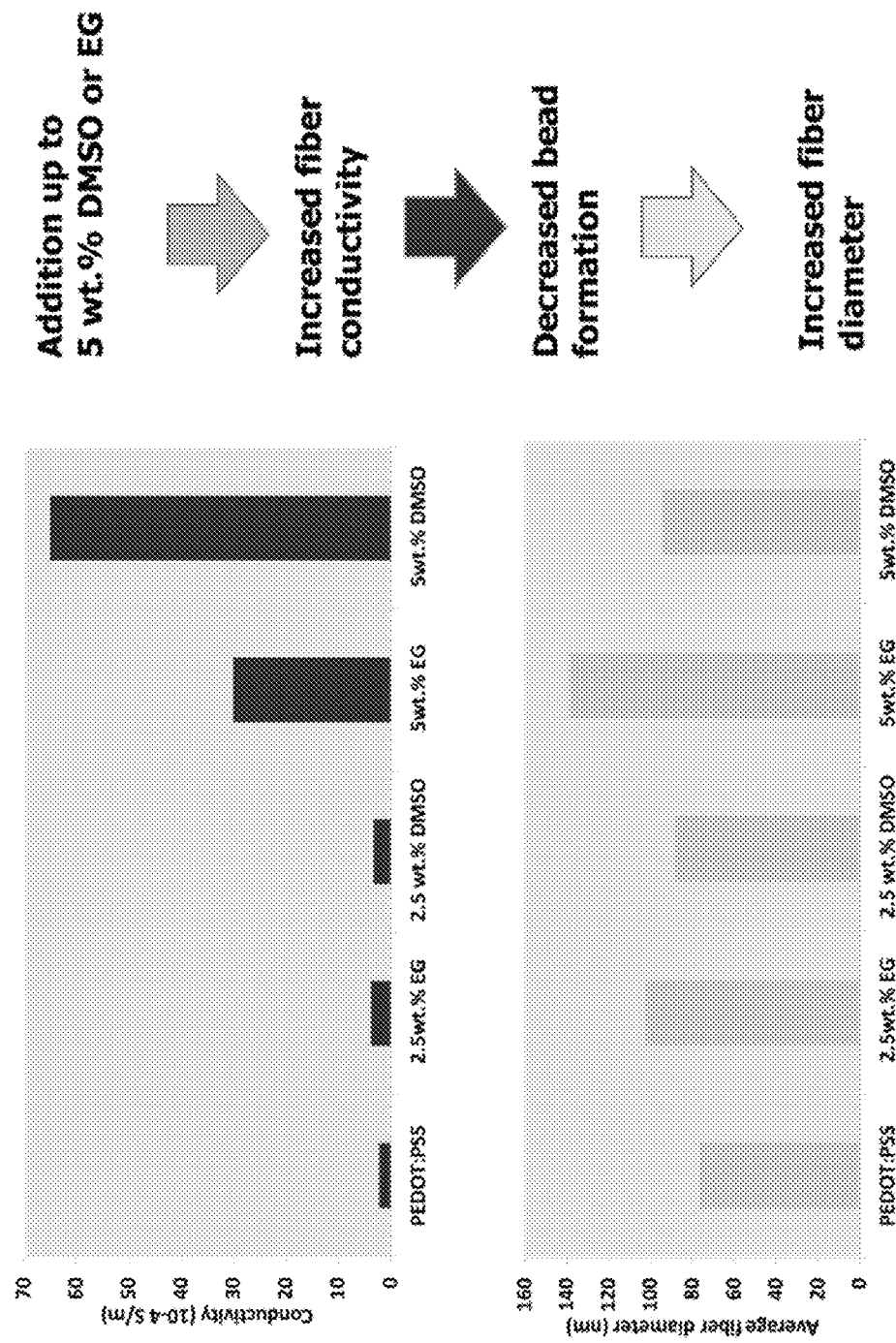

FIG. 27. Influence of co-solvents on conducting polymer nanofiber conductivity and average diameter.

Figure 28:
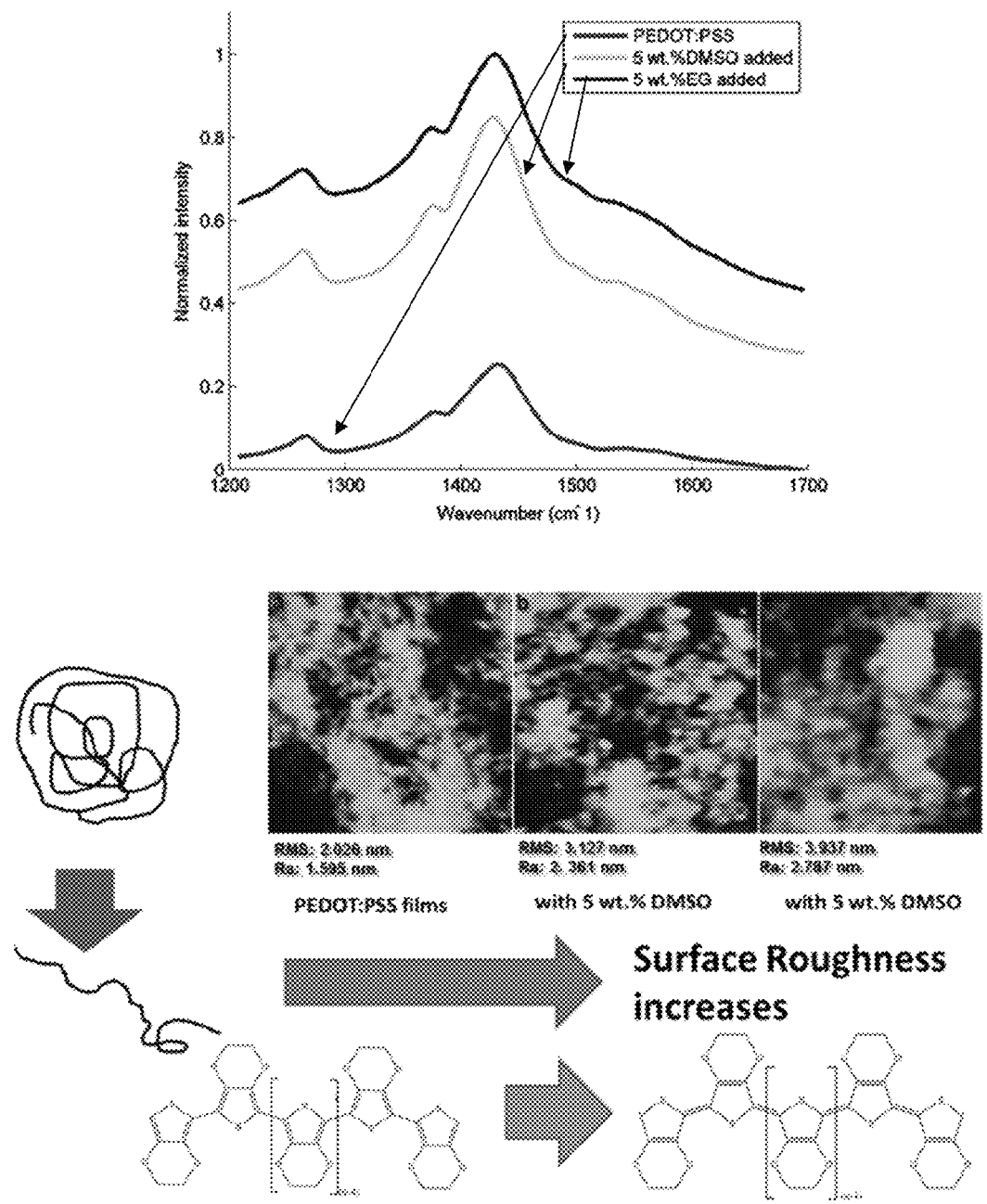

FIG. 28. Change in PEDOT:PSS chain orientation from coiled to elongated as evidenced by Raman spectroscopy of fibers and AFM surface roughness of films.

Figure 29:
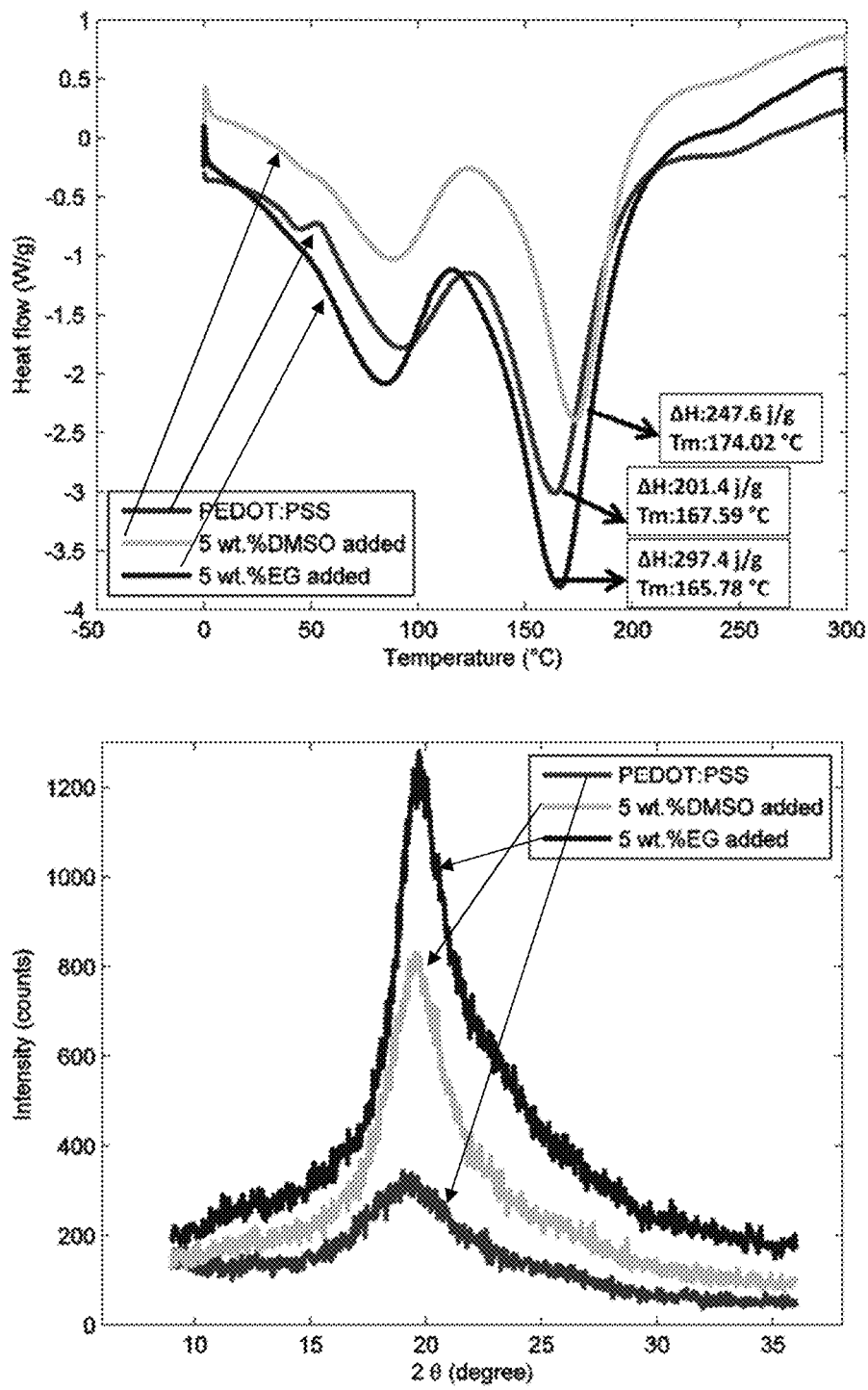

FIG. 29. Changes in differential scanning calorimetry (DSC) measurements of PEDOT:PSS nanofibers after addition of 5 wt. % EG or DMSO in spinning dope and XRD patterns of PEDOT:PSS nanofibers and nanofibers were electrospun from spinning dope with 5 wt. % of DMSO, or EG.

Figure 30:
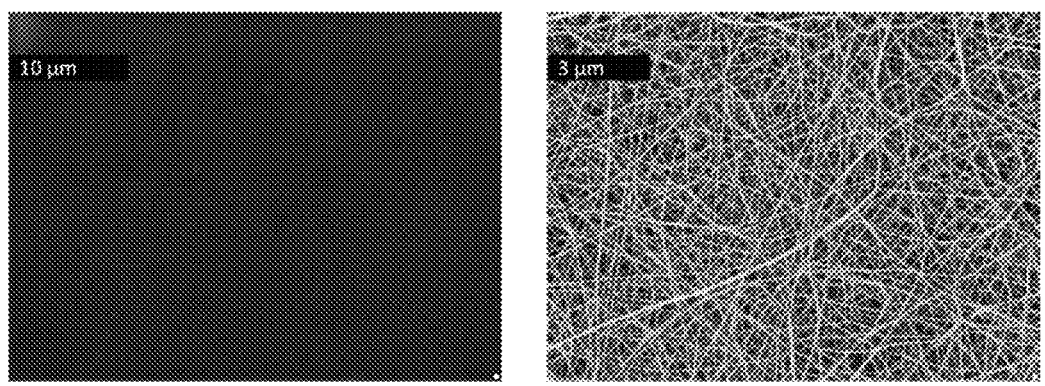

FIG. 30. Comparison of (LH) as spun and (RH) crosslinked conducting polymer nanofibers after immersion in water for 2 days.

Figure 31:
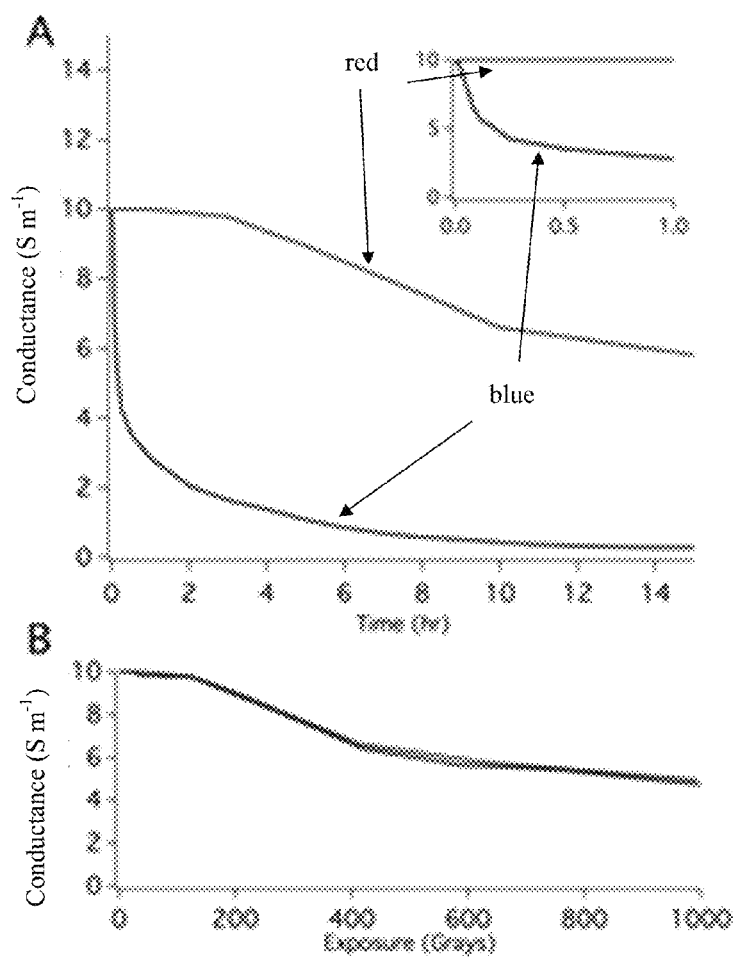

FIG. 31. The conductivity of conducting polymer nanofibers exposed to (a) both Gamma, shown in red, and X-ray, shown in blue, irradiation for 15 hours, and (b) Gamma and X-rays with equalized exposure in Grays up to 1000 Grays.

Figure 32:
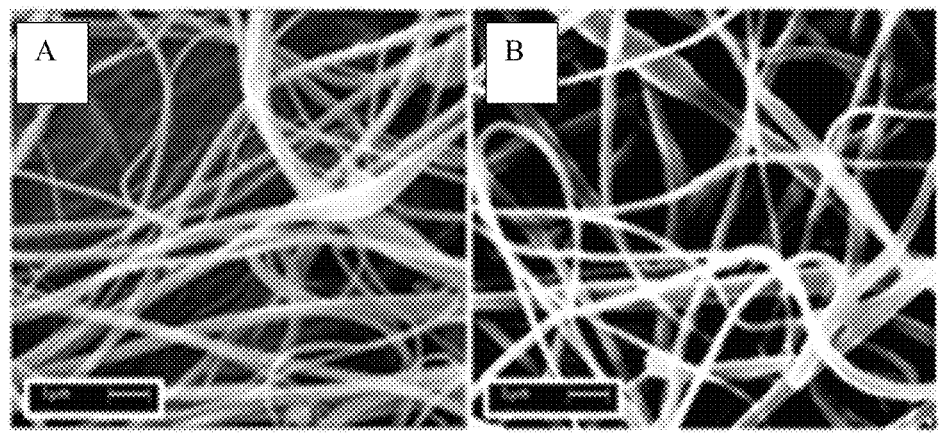

FIG. 32. SEM images of (a) non-irradiated and (b) 100 Gray Gamma irradiated conducting polymer nanofibers.

Figure 33:
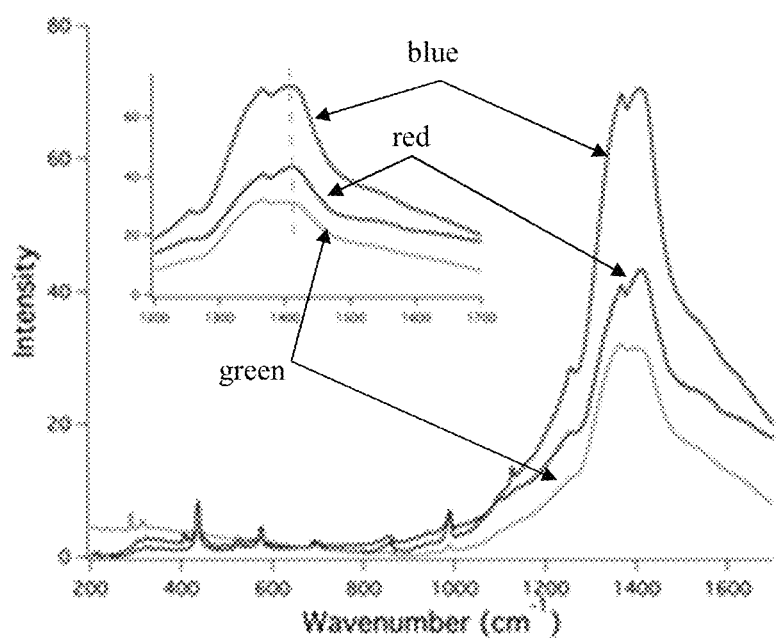

FIG. 33. Raman spectra of irradiated conducting polymer nanofibers. The blue line represents non-irradiated fibers, the red line represents one hour of x-ray irradiation and the green line represents 19 hours of x-ray irradiation. As shown in the insert, a spectrum of 1200-1700 $cm^{-1}$ illustrates the shift in the symmetric $C_\alpha$—$C_\beta$ stretch.

Figure 34:
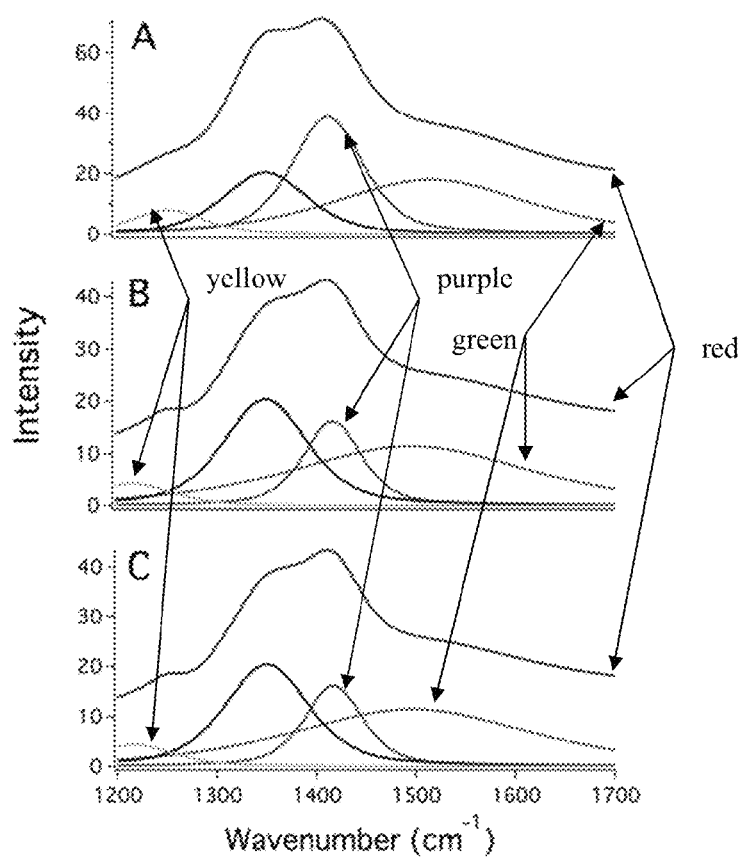

FIG. 34. Curve fits of the Raman spectra of conducting polymer nanofibers which are (a) non-irradiated, (b) one hour of x-ray irradiation, and (c) 19 hours of x-ray irradiation. The red line is the overall fit, the green line represents the asymmetric C=C stretch, the purple line is the symmetric $C_\alpha$=$C_\beta$ stretch, the blue line is the $C_\beta$—$C_\beta$ stretch, and the yellow line represents the $C_\alpha$=$C_{\alpha'}$ stretch.

Figure 35:
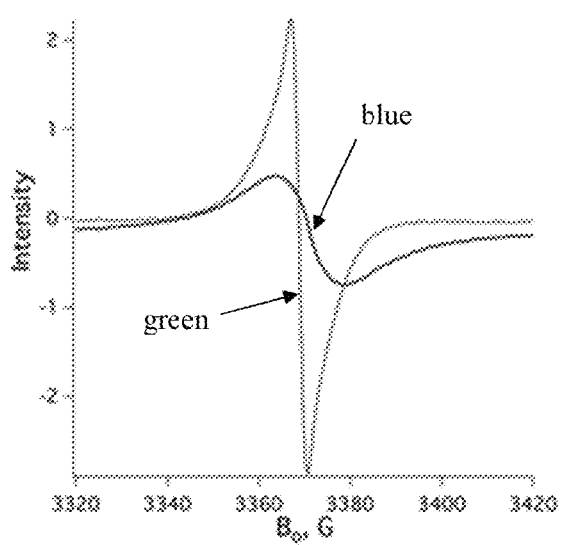

FIG. 35. Solid state ESR spectra of irradiated and non-irradiated conducting polymer nanofibers. The blue line represents nanofibers which have not been exposed to any irradiation while the green line represents nanofibers exposed to 19 hours of x-ray irradiation.

DETAILED DESCRIPTION OF THE DISCLOSURE

The present disclosure provides conducting polymer nanofibers and methods of making such nanofibers. The disclosure also provides uses of such nanofibers. The uses include, for example, methods of using such nanofibers and devices comprising such nanofibers.

In an aspect, the disclosure provides methods of making conducting polymer nanofibers. The methods can include use of a non-conducting polymer and, optionally, an organic solvent.

In an embodiment, the method comprises the steps of: a) providing a spinning dope and b) processing the dope such that conducting polymer nanofibers are formed.

The spinning dope is the mixture from which the nanofibers are formed. The spinning dope comprises a non-conducting polymer, a conducting polymer, a surfactant, and an aqueous solvent. The dope optionally includes a surface-functionalizing polymer. The dope optionally includes a cross-linking agent. For example, the spinning dope can be a mixture comprising suspended particles (e.g., conducting polymer particles and/or non-conducting polymers), a solution comprising the conducting polymer particles and/or non-conducting polymers), a melt, or a combination thereof. The components of the spinning dope (e.g., the conducting polymer, the non-conducting polymer, solvents, non-ionic surfactants, cross-linking agents, and surface-functionalizing polymers) are percentages by weight based on the total weight of the dope.

It is desirable that the spinning dope be formed without agglomeration of the conducting polymer. In an embodiment, the spinning dope is formed by adding an aqueous solution of the non-conducting polymer (e.g., PVA) to an aqueous suspension of the conducting polymer (e.g., PEDOT:PSS) such that the dope is substantially free of agglomerates. In an embodiment, there are no observable agglomerates in the dope. Agglomerates, if present, can be observed by methods known in the art. Examples of such methods include microscopy methods (e.g., scanning electron microscopy).

The spinning dope includes a non-conducting polymer. It is desirable that the non-conducting polymer be water-soluble.

In an embodiment, the non-conducting polymer has a water solubility of at least 0.1% by weight. Without intending to be bound by any particular theory, it is considered that the non-conducting polymer provides elongational viscosity to the spinning dope. Suitable non-conducting polymers are commercially available or can be made by methods known in the art.

Examples of suitable non-conducting polymers include poly(vinyl alcohol) (PVA), poly(ethylene oxide) (PEO), poly(acrylic acid) (PAA), and combinations of such polymers. The non-conducting polymer can be present at 0.5% to 8% by weight, including all values to 0.1% by weight and ranges therebetween. In various embodiments, the non-conducting polymer is present at 0.5% to 4% by weight, 0.5% to 3% by weight, 0.5% to 2% by weight, or 0.5% to 1% by weight.

The non-conducting polymers can have a broad range of molecular weight (e.g., $M_w$). Polymers having a molecular weight ($M_w$) of 20,000 g/mol to 130,000 g/mol, including all values to the 100 g/mol and ranges therebetween. In an embodiment, the non-conducting polymer is PVA having a molecular weight ($M_w$) of 20,000 g/mol to 130,000 g/mol, including all values to the 100 g/mol and ranges therebetween.

The spinning dope includes a conducing polymer. Examples of suitable conducting polymers include poly(3,4-ethylenedioxythiophene), poly(fluorene)s, polyphenylenes, polypyrenes, polyazulenes, polynaphthalenes, poly(pyrrole)s (PPYs), polycarbazoles, polyindoles, polyazepines, polyanilines (PANIs), poly(thiophene)s (PTs), poly(p-phenylene sulfide) (PPSs), poly(acetylene)s (PACs), poly(p-phenylene vinylene) (PPV), and combinations of such polymers. In an embodiment, the conducting polymer is not poly(pyrrole). Suitable conducting polymers are commercially available or can be made by methods known in the art.

In an embodiment, the conducting polymer is a combination of poly(3,4-ethylenedioxythiophene) and poly(styrenesulfonate) (PEDOT:PSS).

The spinning dope includes a surfactant. Non-ionic surfactants can be used. Examples of suitable non-ionic surfactants include alcohol ethoxylates, alkylphenol ethoxylates, ethylene oxide/propylene oxide block copolymers, alkylpolyglycosides, alkyl N-methylglucamides, amine oxides, alkanolamides, amine ethoxylates, and methyl ester ethoxylates. Combinations of non-ionic surfactants can be used. For example, Triton X-100® can be used. Suitable non-ionic surfactants are commercially available or can be made by methods known in the art.

The aqueous solvent can be, for example, water or a mixture comprising water. In an embodiment, the spinning dope comprises water and an organic solvent. It is desirable that the organic solvent be miscible with water and has sufficient volatility such that the solvent evaporates during the fiber forming process such that the solvent does not interfere with nanofiber formation. Without intending to be bound by any particular theory, it is considered that the presence of the organic solvent in the spinning dope results in the conducting polymer having a linear morphology.

In an embodiment, the solvent is a mixture of water and an organic solvent. Examples of suitable organic solvents include polar aprotic solvents (such as dimethyl sulfoxide, formamides (such as dimethylformamide), and acetonitrile), diols (such as ethylene glycol and propylene glycol), and cyclic ethers (such as tetrahydrofuran and dioxane). Combinations of organic solvents can be used. The organic solvent is also referred to herein as a functional additive. The organic solvent can be present at 2.5% by weight to 20% by weight, including all integer values and ranges therebetween. In an embodiment, the organic solvent is present at 5% by weight to 7.5% by weight. In an embodiment, DMSO is the organic solvent and is present in the spinning dope at 2.5% by weight to 7.5% by weight. Suitable organic solvents are commercially available or can be made by methods known in the art.

The spinning dope can include a surface-functionalizing polymer. A spinning dope comprising a surface-functionalizing polymer provides conducting polymer nanofibers that are surface functionalized. The surface-functionalizing polymer can be added to the spinning dope to fabricate surface-functionalized nanofibers (e.g., positively and negatively charged nanofibers). Also, after fabrication of the nanofibers, the nanofibers can be subjected to various processes to provide surface-functionalized nanofibers. The surface functionalization can be provided by moieties covalently bonded to the surface of the nanofiber. In various embodiments, nanofibers can be prepared from a surface-functionalizing polymer such as cellulose nitrate or cellulose nitrate acetate, to provide available nitrate groups at the fiber surface.

In an embodiment, a biorecognition or biological sensing (biosensor) element can be added to the electrospinning dope prior to the electrospinning of the conductive nanofibers. The biorecognition element can be used for identification, isolation and/or interaction with an analyte of interest, and is the interface between the sample and the nanofiber. The intrinsic biological selectivity of the biorecognition element confers selectivity to the nanofiber. Biorecognition element can be derived from natural sources, e.g. bacteria, plant or animal, but can also be generated artificially by molecular imprinting techniques. Any suitable biorecognition element known in the art can be used, including, but not limited to, antibodies, aptamers, peptides, proteins (e.g., binding proteins, enzymes and apoenzymes), binding phages, nucleic acids (e.g., nucleic acid probes such as RNA or DNA probes), receptors, molecular imprinted polymers, and other small molecules with biorecognition properties.

In an embodiment, the conducting polymer nanofiber(s) is/are functionalized with a multifunctional molecule of molecular weight ranging from 200 to 500, for example, biotin, fluorescein or digoxygenin. The macromolecule can provide a biorecognition or biological sensing element. The multifunctional molecule can be incorporated in the electrospun thermoplastic polymer nanofiber in an amount ranging from 1% by weight to 20% by weight, including all integer % by weight values and ranges therebetween.

The multifunctional molecule functionalized nanofiber(s) can be joined with a binding agent that can associate with the multifunctional molecule. For example, the second binding agent can be avidin/streptividin, antibody, receptor, protein A, protein G, other protein, DNA and RNA molecules, PNA (peptide nucleic acid), enzyme or lectin. It is desirable that the association constant between the macromolecule and binding agent be such that there is a desirable level of interaction between the macromolecule and binding agent. For example, the association constant between biotin and avidin is $10^{-15}$ $M^{-1}$ and between biotin and streptavidin is $10^{-16} M^{-1}$. In an embodiment, both the multifunctional molecule and binder are in the spinning dope.

In an embodiment, the conducting polymer nanofiber(s) is/are surface-functionalized with a second binding agent that joins with the binding agent. For example, the second binding agent is biotinylated for joining with a streptavidin or avidin binding agent and can be, for example, antibody, antigen, DNA or other molecule, including reporter probe, e.g., oligonucleotide probe or antivirus or DNA or RNA sequences, that hybridizes with a target. The second binding agent can be joined to the binding agent by simple incubation with the binding agent functionalized conducting polymer nanofiber(s) (e.g., by incubation at a temperature ranging from 0 to 98° C. or by shaking or mixing during an incubation period).

For example, use of a surface-functionalizingpolymer such as poly(methyl vinyl ether-alt-maleic anhydride) provides conducting polymer nanofibers having a persistant negative surface charge, use of 1,5-dimethyl-1,5-diazaundecamethylene polymethobromide and/or hexadimethrine bromide) (polybrene) provides a persistant positive surface charge, and use of polystyrene8K-block-poly(ethylene-ran-butylene)25K-block-polyisoprene10K (PS8K-b-P(E/B)25K-b-PI10K) grafted with Brij 76 alcohol ($C_{18}H_{37}(OCH_2CH_2)_nOH$, n~10) provides a persistant amphiphilic fiber surface.

The conducting polymer nanofiber can be crosslinked. It is desirable that the conducting polymer nanofibers be crosslinked such that the conducting polymer nanofibers are not water soluble. By "not water soluble" it is meant that the nanofibers are not soluble to a detectable level. Methods of detecting the water-solubility of the nanofibers are known in the art.

The nanofiber can be crosslinked by incorporating a cross-linking agent in the spinning dope. The conducting polymer nanofibers can also be crosslinked by exposing the conducting polymer nanofibers after formation to a crosslinking agent. The crosslinking agent can be a bifunctional cross-linking agent. The cross-linking agents (e.g., a bifunctional crosslinking agent) can have hydroxy moieties, amine moieties, aldehyde moieties, acid moieties, cyanate moieties, isocyanate moieties, sulfonate moieties, urea moieties, or a combination thereof. An example of a suitable crosslinking agent is glutaraldehyde. Suitable cross-linking agents are commercially available or can be made by methods known in the art.

The extent of crosslinking is dependent on the amount of crosslinking agent used. For example, a ratio of moles of non-conducting polymer (e.g., PVA) to moles of crosslinking agent (e.g., GA) of 1:20 to 1:60, including all values and ranges therebetween, can be used.

The spinning dope is processed such that conducting polymer nanofibers are formed. The spinning dope can be processed by methods known in the art. Examples of suitable processes include electrospinning, force spinning, and centrifugal spinning.

In an embodiment, the spinning dope is processed by electrospinning Electrospinning is well known in the art and identification of parameters and conditions that provide conducting polymer nanofibers is within the purview of one having skill in the art. It may be desirable to carry out the electrospinning in a low humidity atmosphere.

For example, the spinning dope is prepared by dissolving the non-conducting polymer (e.g., PVA polymer) in a conducting polymer (e.g., PEDOT:PSS) solution or suspension and holding the mixture at a temperature of 95° C. (e.g., in an oven) for 4 hours. Then, the surfactant and organic solvent are added into the mixture at room temperature. This mixture is stirred (e.g., with a magnetic stirrer) at room temperature for about 1 hour. The fibers are spun at room temperature. Generally, the spinning is carried out in an atmosphere having a relative humidity of less than 50%. The spinning time depends on the quantity of nanofibers to be collected. For example, to collect a few fibers on the electrode, generally, it takes two seconds, and in the case of a sensor, a spinning time of, generally, one to two minutes is used to deposit the nanofibers on the electrode. A rotating collector can be used to form a yarn.

In an aspect, the disclosure provides a conducting polymer nanofiber and a plurality of conducting polymer nanofibers.

In an embodiment, the disclosure provides a conducting polymer nanofiber or plurality of conducting polymer nanofibers made by a method disclosed herein.

The plurality of conducting polymer nanofibers can be, for example, a yarn or a plurality of randomly oriented nanofibers layered on a web or collected as a non-woven fabric or membrane.

The conducting polymer nanofibers can have a broad range of conductivity. For example, a single fiber exhibits a conductivity of at least 0.1 S m$^{-1}$. In various examples, a single fiber exhibits a conductivity of at least 1 S m$^{-1}$, at least 5 S m$^{-1}$, at least 10 S m$^{-1}$, at least 20 S m$^{-1}$, or at least 50 S m$^{-1}$. For example, a single fiber exhibits a conductivity of 0.1 S m$^{-1}$ to 1000 S m$^{-1}$, including all values to the 0.1 S m$^{-1}$ and ranges therebetween. For example, a non-woven mat of fibers exhibits a conductivity of at least $1\times10^{-4}$ S m$^{-1}$. In various examples, a non-woven mat exhibits a conductivity of at least $1\times10^{-5}$ S m$^1$, at least 1 S m$^{-1}$, at least 10 S m$^{-1}$, at least 1000 S m$^{-1}$, or at least 1000 S m$^{-1}$. For example, a non-woven mat exhibits a conductivity of $1\times10^{-5}$ S m$^{-1}$ to 1000 S m$^{-1}$, including all values to the $1\times10^{-5}$ S m$^{-1}$ and ranges therebetween.

The conducting polymer nanofibers can have a broad range of both diameter and length. The fibers can have a circular cross sectional shape. For example, the nanofiber has a diameter or the nanofibers have an average diameter of 100 microns to 800 microns, including all integer micron values and ranges therebetween. For example, the nanofibers have a length of at least 100 microns. In another example, the nanofibers have a length of 100 microns to 1 m, including all values to the 10 microns and ranges therebetween.

The composition of the conducting polymer nanofibers can vary. The nanofibers comprise 5% by weight to 95% by weight of conducting polymer (e.g., PEDOT:PSS), including all integer % by weight values and ranges therebetween, and from 5% by weight to 95% by weight of non-conducting polymer (e.g., PVA), including all integer % by weight values and ranges therebetween. In an embodiment, the nanofibers consist essentially of conducting and non-conducting polymers in these ranges, where any other materials do not materially affect the properties (e.g., conductivity of the nanofibers). In an embodiment, the nanofibers consist of conducting and non-conducting polymers in these ranges. The composition of the conducting polymer nanofibers generally correlates to the amounts of conducting polymer and non-conducting polymer in the spinning dope.

The conducting polymer nanofiber(s) can be surface functionalized. The nanofibers can be functionalized by methods known in the art. For example, a surface-functionalizing polymer or macromolecule can be added to the spinning dope or the conducting polymer nanofibers can be subjected to post fiber formation processes (e.g., layer by layer deposition).

The conducting polymer nanofibers can have surface-functionalizing moieties covalently bound to the surface of the nanofibers. For example, the conducting polymer nanofibers can be subjected to a plasma treatment process to provide a fiber that can be treated such that conducting polymer nanofibers having moieties covalently bound to the surface of the fibers are formed.

In an embodiment, the nanofiber comprises positive charges and/or negative charges on a surface of the nanofiber. In another embodiment, the nanofiber comprises a chemical functionality on a surface of the nanofiber, e.g., a hydrophobic or hydrophilic nanofiber surface, a nitrate group at the nanofiber surface or resistance to non-specific binding.

In another embodiment, the nanofiber comprises a functional group on a surface of the nanofiber that can be protonated or deprotonated. The functional group can be selected from the group consisting of amine, nitrate, carboxyl, hydroxyl, peroxide, sulfhydryl, maleimide, reactive group and protected reactive group. Any reactive group or protected reactive group can be used.

In an aspect, the disclosure provides uses of the conducting polymer nanofibers. For example, the conducting polymer nanofibers can be used in devices and methods of using the nanofibers.

In an embodiment, a device comprises a conducting polymer nanofiber or a plurality of conducting polymer nanofibers. Devices based on both micro/nano-fabricated chips and breadboard constructions can comprise integrated conductive nanofibers. The device may comprise a signaling element for radiation detection based on the integrated conductive fibers. For example, an illuminating light emitting diode (LED), liquid crystal display, or other types of signaling can be considered based on requirements of the devices, e.g., low energy consumption for the overall device and ease of reading the signal. Examples of other types of signaling include auditory signals, vibrations, and combinations thereof with a chosen visible display or signal.

In various embodiments, the radiation detector device has a visually appealing design targeted towards acceptance of these devices by broad populations. Examples of such designs include aesthetic wearable devices such as pendants, broaches, wristbands, etc. In various other embodiments, the radiation detector device is integrated in personal electronic devices such as smart phones, personal GPS, watches, tablet computers etc.

In an embodiment, the device is an ionizing radiation sensor comprising: a substrate; a patterned metal layer disposed on the substrate; and the conducting polymer nanofiber or plurality of conducting polymer nanofibers are in contact with at least a portion of the patterned metal layer.

A wide variety of substrates can be used. The substrates can be flat, flexible, rough, smooth, or patterned. Examples of suitable substrate materials include polymer substrates, agarose, glass, metals, silicon, or any other suitable substrate known in the art.

Examples of suitable polymer substrate materials include poly(methyl methacrylate) (PMMA), polycarbonate (PC), polystyrene (PS), polydimethylsiloxane (PDMS), polyethylene (PE), cyclic olefin copolymer (COC), or other suitable polymers known in the art.

The substrate has conducting metal layer or conducting polymer layer disposed on the substrate. Examples of suitable conducting metals include gold, copper, titanium, chromium, platinum, silver, tungsten, or a combination thereof. The conducting layer can be patterned. For example, the metal layer can patterned such that a plurality of electrodes and, optionally, electrical contacts are formed. In an embodiment, the electrodes are an interdigitated microelectrode (IDMA) array.

The conducting polymer nanofiber or plurality of conducting polymer nanofibers are disposed on the substrate such that conducting polymer nanofiber or plurality of conducting polymer nanofibers is in contact with at least a portion of the metal layer (e.g., patterned metal layer) such that the conducting polymer nanofiber or plurality of conducting polymer nanofibers form a portion of a metal circuit. It is desirable that the conducting polymer nanofiber or plurality of conducting polymer nanofibers have a diameter of 100 nanometers to 200 nanometers, including all integer nanometer values and ranges therebetween.

In an embodiment, the conducting polymer nanofiber or plurality of conducting polymer nanofibers are surface functionalized such that the nanofiber(s) interacts with an analyte such that the conductivity changes and the change in conductivity correlates to the concentration of the analyte. For example, surface-functionalized polymers as described herein can be used.

In an embodiment, a method for detecting ionizing radiation comprises the steps of: exposing the conducting polymer nanofiber or plurality of conducting polymer nanofibers to ionizing radiation; and measuring a change in conductivity of the plurality of conducting polymer nanofibers. The change in conductivity correlates to the total exposure of the conducting polymer nanofibers to ionizing radiation. For example, the ionizing radiation can be x-ray radiation, gamma radiation, or a combination of such radiation.

In an embodiment, a method for detecting an analyte comprises the steps of: exposing the conducting polymer nanofiber or plurality of conducting polymer nanofibers to an analyte; and measuring a change in conductivity of the plurality of conducting polymer nanofibers. The change in conductivity correlates to the concentration of analyte. For example, surface-functionalized polymers as described herein can be used.

The steps of the methods described in the various embodiments and examples disclosed herein are sufficient to carry out the methods of the present invention. Thus, in various embodiments, the methods consists essentially of the combination of the steps of the methods disclosed herein. In various other embodiments, the methods consist of such steps.

The following examples are presented to illustrate the present invention. They are not intended to limiting in any manner.

Example 1

This example describes fabrication and characterization of conducting polyvinyl alcohol nanofibers.

Conducting polyvinyl alcohol (PVA) nanofibers with diameters ranging from 100 nm to 300 nm were fabricated by an electrospinning method from spinning dopes of the dissolved PVA polymer in aqueous dispersion of poly(3,4-ethylenedioxythiophene) poly(styrenesulfonate) (PEDOT:PSS). Using a chemical cross-linking agent, glutaraldehyde (GA), water insoluble conducting PVA nanofibers were obtained through an in-situ crosslinking of PVA polymer during electrospinning. The cross-linked conducting polymer nanofibers maintained fiber morphology after a soaking in water and exhibited high conductivity (4-8 S m$^{-1}$). To create PVA nanofibers that were both conducting and had a persistent negative surface charge, Poly(methyl vinyl ether-alt-maleic anhydride) (PVMA) polymer was added to the spinning dope. Organic conducting PVA nanofibers with or without negatively charged surfaces can be used to create highly sensitive, real-time electrically based sensors for biological and chemical species and for radiation detection.

One-dimensional conducting PVA nanofibers are promising nanomaterials for biosensor applications in solution-processable microfluidic device. Especially with the hydrophilic property, the PVA fibers have a good affinity to solution so that they are desirable materials to detect the analyte contained in solution. This example presents the first study on fabrication of the conducting PVA nanofibers including a cross linked-conducting and a functionalized-conducting polymer nanofiber. The hydrophilic-conducting PVA nanofibers were successfully fabricated by a simple electrospinning method using the spinning dopes made with the mixtures of a specific ratio of PVA to PEDOT:PSS. To prevent the hydrophilic nanofibers from dissolving in water, a cross-linking agent was added to the dissolved PVA solutions and then electrospun to fabricate in-situ crosslinking nanofibers. The negatively charged-conducting PVA nanofibers were obtained using functional spinning dopes which were prepared by mixing both solutions of PVMA and PVA/PEDOT: PSS. All the fiber morphologies were evaluated by SEM images and the conductance of the fabricated fibers was characterized using interdigitated electrodes.

Experimental. Three types of spinning dopes were prepared to fabricate each conducting PVA fibers. First, 4.0 wt. % PVA polymers were dissolved in an aqueous dispersion of PEDOT:PSS at 95° C. for 4 hours and then 5 wt. % dimethyl sulfoxide (DMSO) and 0.5 wt. % nonionic surfactant Triton X-100 were added to the PVA solution. Second, a GA was added in the solution which was prepared by the first method. The quantity of GA was adjusted by varying the mole to mole ratio of PVA to GA (1/20, 1/50, 1/80). Last, 10 wt. % PVMA compared with PVA polymers was dissolved in the aqueous dispersion of PEDOT:PSS at 90° C. for 15 min and then mixed with the second solution (PVA/GA=1/50). The morphology of all electrospun fibers was obtained via a Leica 440 scanning electron microscope (SEM). The fibers were spun on an electrode substrate of an interdigitated microelectrode array (IDMA) which consists of 75 pairs of electrode fingers, each 15 μm wide, spaced by 5 μm and 5 mm long. The electrodes were made with 35 nm Au on top of a 5 nm thick adhesion layer. As a voltage sweep (−0.5 to 0.5 V) was applied to a sample at a sweeping rate of 100 mV/s, the conductance of nanofibers was measured using a two-probe method in accordance with ASTM 4496-04 by an electrometer and then the conductivity was calculated.

Figure 1:
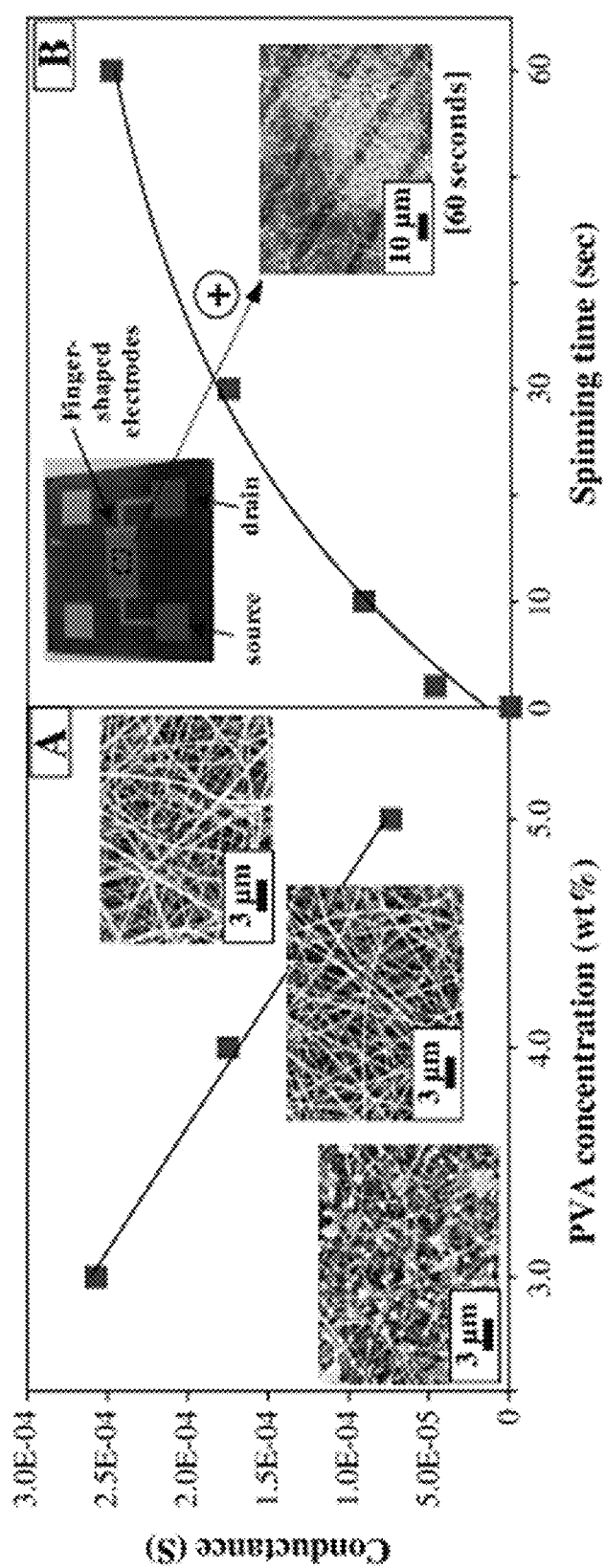
FIG. 1. Electrical conductance of PVA nanofibers as a function of PVA contents in aqueous dispersion of PEDOT:PSS (A) and as a function of spinning time on the electrodes (B).

Results and discussion. PVA polymers were dissolved in the aqueous dispersion of PEDOT:PSS to facilitate fiber formation. As the PVA polymers are insulating, higher content of PVA increases the non-conducting bathers to charge transport in PEDOT:PSS. In the present study, the PVA concentration was adjusted from 3 wt. % to 5 wt. % in the aqueous dispersion, which was the feasible range over which the as-spun fibers conduct as well as form fiber morphology. The spinning dope made with 4 wt. % PVA was effectively electrospun on an aluminum foil and an IDMA electrode (insets in FIG. 1). The electrospun nanofibers showed good fiber morphology without beads on the fiber. With the increase of PVA concentration in the solution, the fiber diameter became slightly thicker. The diameter of the fibers spun by 4 wt. % PVA spinning dope ranged from 100 nm to 200 nm, whereas the one by 5 wt. % PVA from approximately 200 nm to 300 nm. In FIG. 1A, lower concentration of PVA (3 wt. %) made lots of beads on the fiber surface, but higher content of PVA (5 wt. %) leaded lower conductance of the fibers. Based on these results, 4 wt. % PVA was used to prepare the spinning dopes for fabricating fibers for the remainder of this study. As the spinning time was increased, more fibers were collected on the electrode and the total conductance was initially increased and then gradually saturated (FIG. 1B). The accumulation of fibers might not be in contact with the electrodes and therefore might less contribute to current.

Figure 2:
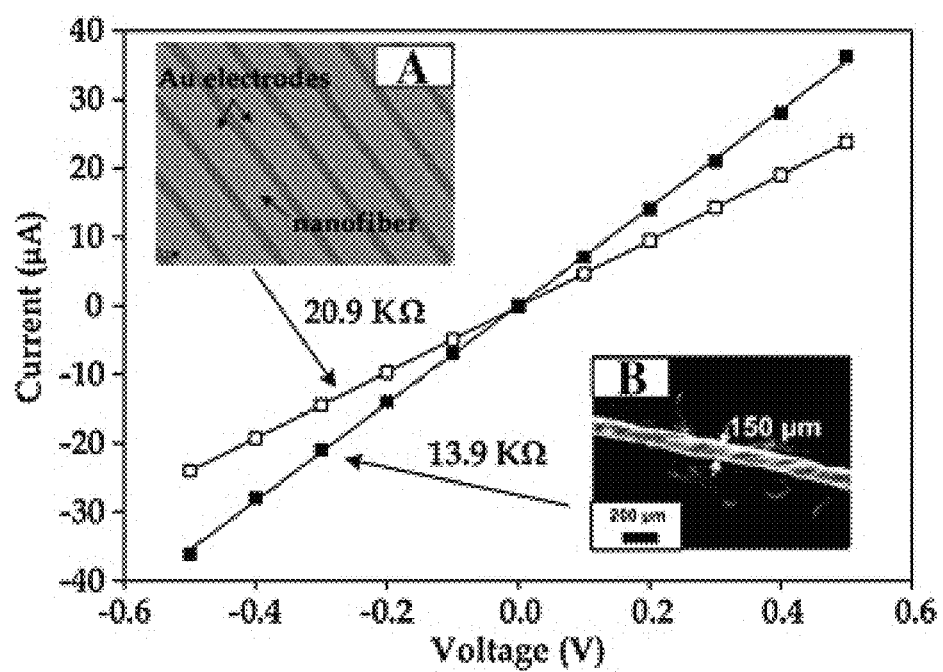
FIG. 2. Current versus voltage relationship for the conducting PVA nanofibers on the electrodes (A) and the yarn formulated during electrospinning (B).

In FIG. 2, a representative relationship of current versus voltage (I-V) characteristics was plotted by measuring the conductance of fibers spun on an IDMA electrode and a formed yarn. The conductance of fibers on the finger-shaped electrodes was measured as 4.8E-05 S which was equivalent to the resistance of 20.9 kΩ. The fiber conductivity could be calculated using the known variables (fiber diameter: 0.1 μm, distance between electrodes: 5 μm). The number of fibers on the 75 pairs of electrodes was around ten, as determined using an optical microscope. Therefore, the PVA fibers had an electrical conductivity on the order of 4.1 S m$^{-1}$. To verify the conductivity of the fibers using a different type of fiber material, a formed yarn was used to measure its conductance. The yarn conductance was 7.2E-5S (resistance 13.9 kΩ). The yarn diameter was around 150 μm and the yarn length at the two-probe method was 2E+4 μm, which yielded a conductivity of 8.2 S m$^{-1}$. The conductivity calculated from the yarn was similar to the result from fibers on the electrodes, which were the same order of magnitude. Therefore, the conductivity of fiber sample was approximately 4-8 S m$^{-1}$ which was higher compared to the ones of the previously reported hybrid nanofibers.

Figure 3:
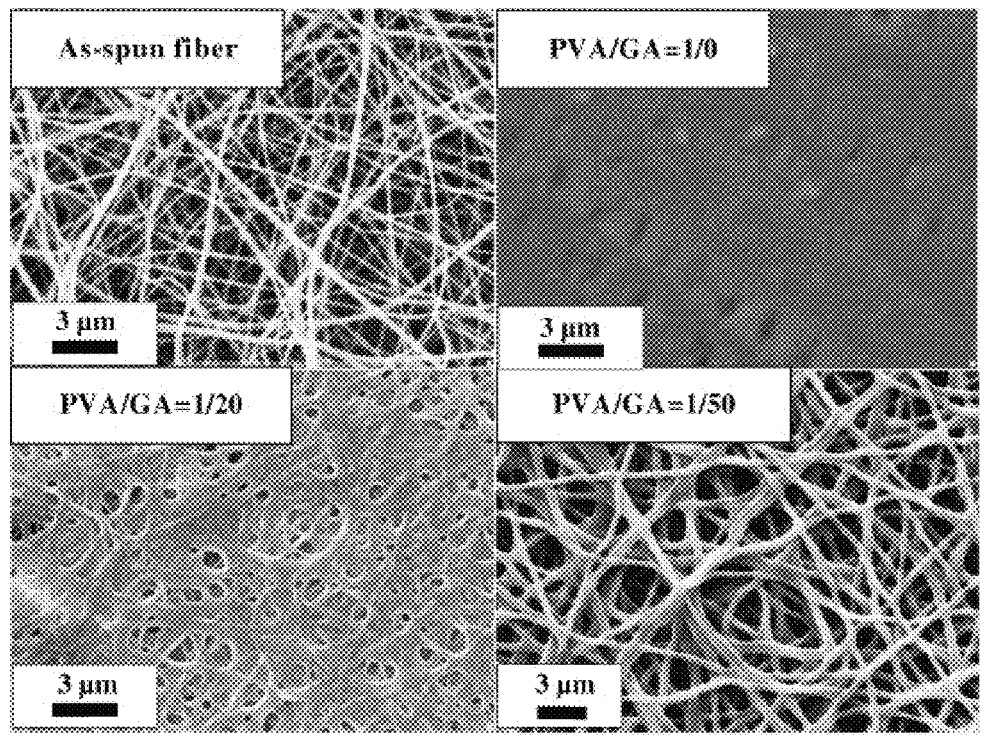
FIG. 3. Fiber morphology after soaking test of fibers made of the different mixing ratio of PVA to GA.

A cross linker was added into the PVA solution by varying the mole to mole ratio of PVA to GA. The fibers fabricated using the three solutions of PVA/GA=1/0, 1/20, and 1/50 were left as they were in room temperature for 5 hours and then soaked in water for 5 min in order to analyze the fiber stability in water. As shown in FIG. 3, the fibers without GA disappeared after soaking test. Meanwhile, the fibers with the ratio PVA/GA=1/50 maintained their fiber morphology but the fibers of PVA/GA=1/20 were considerably swollen.

Figure 4:
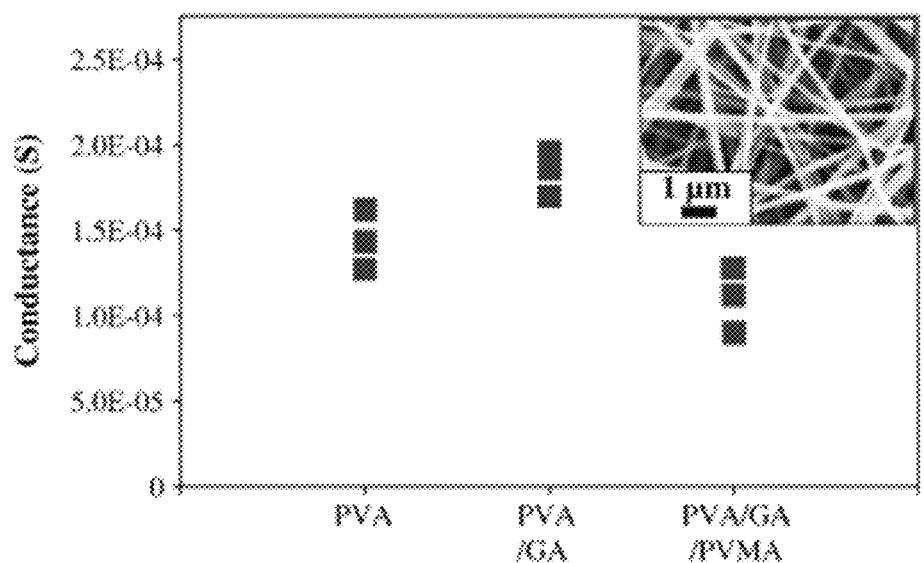
FIG. 4. Conductance results of PVA, PVA/GA, and PVA/GA/PVMA fibers (SEM image of PVA/GA/PVMA fibers in inset).
Figure 5:
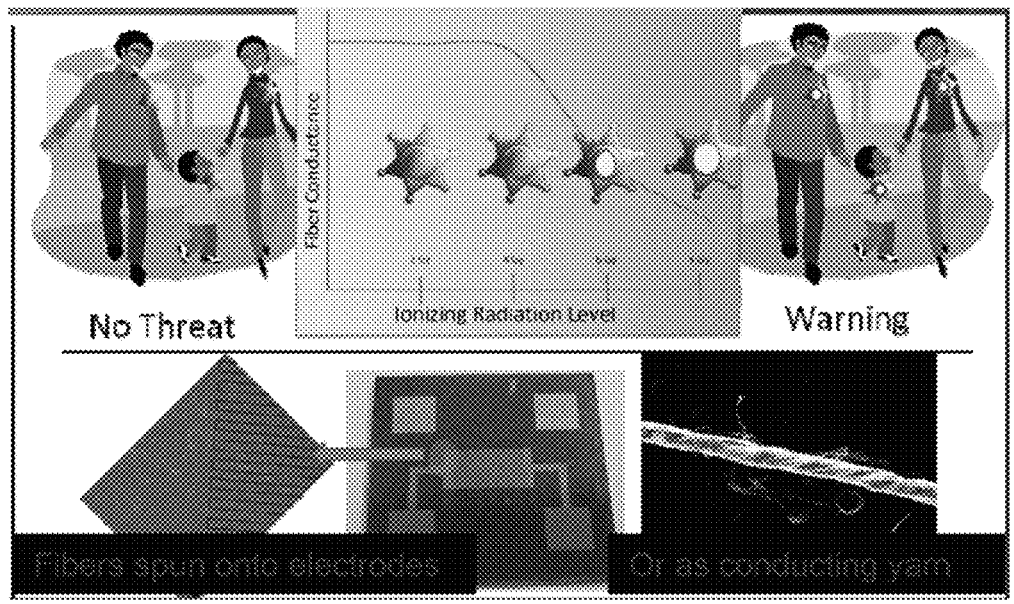
FIG. 5. (TOP) Illustration of personal wearable radiation detector device in accordance with the embodiments. (BOTTOM) Conductive fibers or yarns spun across electrodes.

In FIG. 4, the conductance of cross-linked fibers (PVA/GA=1/50, spun on an electrode for 30 seconds) shows slightly higher results than the conducing PVA fibers. The cross-linked polymers may help the charge transport in the networked-polymer chains as bridges between neighbor chains. The PVMA polymer was blended with the PVA solution to provide partial negative (δ−) charge at the fiber surface in the solutions with pH greater than its isoelectric point. In this example, the PVMA polymers were added into the PVA/GA solution and the conducting PVA nanofibers with a negative surface charge were fabricated. The fabricated functional nanofibers (PVA/GA/PVMA) show a slightly lower conductance than the conducting PVA fibers as shown in FIG. 4. With the addition of the PVMA into the PVA, the diameter of the electrospun fibers became thicker (around 350 nm) than the PVA fibers, which caused reduction of conductance.

Electrospinning dopes were prepared by dissolving PVA polymers in the aqueous dispersion of PEDOT:PSS. Without using a toxic solvent, the hydrophilic conducting PVA nanofibers were successfully fabricated by optimizing the PVA contents in the aqueous dispersion. Water insoluble conducting PVA nanofibers were obtained through an in-situ crosslinking of PVA polymers by adding a GA in the dissolved PVA solution. The cross-linked conducting fibers showed slightly higher conductance than the conducting PVA fibers and maintained good morphology after a soaking test in water. In addition, the conducting PVA nanofibers with functionally negative charges were electrospun using the mixture made with incorporating PVMA polymers into the PVA/GA solution. The negatively charged nanofibers conducted as well. All the fabricated fibers showed electrical semi-conductivity. Conducting PVA nanofibers such as those made in this example have potential applications as highly sensitive, real-time electrically based sensors for biological and chemical species.

Example 2

This example describes a wearable ionizing radiation detector for general populations.

Conducting polymeric fibers are produced by electrospinning solutions of a fiber forming polymer and a conducting polymer (PEDOT:PSS). Fibers are integrated into circuits by spinning across electrodes patterned on chips or incorporating as yarns in place of wires on 'breadboard' circuits. Conductivity of the fibers decreases with exposure to ionizing radiation. The fibers can be incorporated in devices such that decreasing conductivity triggers a signal indicating radiation exposure. Such devices can provide real time, portable, wearable, inexpensive signaling of radiation exposure at threshold levels relevant for warning of danger to humans.

Conductivity of nanofibers may be further optimized for maximum initial conductivity, response to ionizing radiation within the range between 4 and 8 Gy and physical robustness. As shown in FIG. 1 A, conductance of PVA/PEDOT:PSS fibers decreases with increasing PVA concentration. Although inclusion of a fiber forming polymer such as PVA is necessary to produce the conducting fibers, post treatment of the fibers can selectively remove the non-conducting material to increase overall conductivity. Other strategies including use of dopants and alternative fiber forming polymers may also be used to increase both initial conductivity and physical robustness of the resulting fibers. The fiber response to ionizing radiation is also dependent on fiber composition and oxygen accessibility to the PEDOT:PSS. Methods for fiber formation, conductivity measurement and controlled irradiation exposure that are described herein.

The conductive polymer, PEDOT:PSS, has high electrical conductivity and environmental stability. Forming fibers rather than films from the PEDOT:PSS has several advantages for both the material and for incorporating the material into devices. The electrospinning process includes elongational flow fields which align polymer chains, including PEDOT:PSS chains along the fiber axis focusing the direction of conductivity. It was shown that these fibers can be collected in specific patterns on chips and also formed into fine diameter yarns.

While in the presence of an ionizing radiation field, it is believed that there are two simultaneous competing mechanisms for change in electrical properties of PEDOT-PSS. The first mechanism is free radical formation along the polymer backbone via chain scission. Once these free radicals are formed, the second mechanism, cross-linking occurs. If the cross-link density becomes higher than that of the original polymer before irradiation, the surface conductivity may increase higher than that of the starting material. Oxygen is a very important factor in the decrease of conductivity and if during irradiation oxygen is present, the free radical may also interact with it to reduce the surface conductivity. This is believed to be due to the propagation of free radicals that form when an oxygen environment is irradiated. These free radicals are formed within the polymer itself and readily react with free oxygen in the surrounding environment to form peroxy radicals.

Of the many types of radiation sensors available today including Geiger counters and dosimeters, none provide a real-time radiation signal within an inexpensive, small and wearable device.

Example 3

This example describes radiation sensitive nanofibers.

Figure 6:
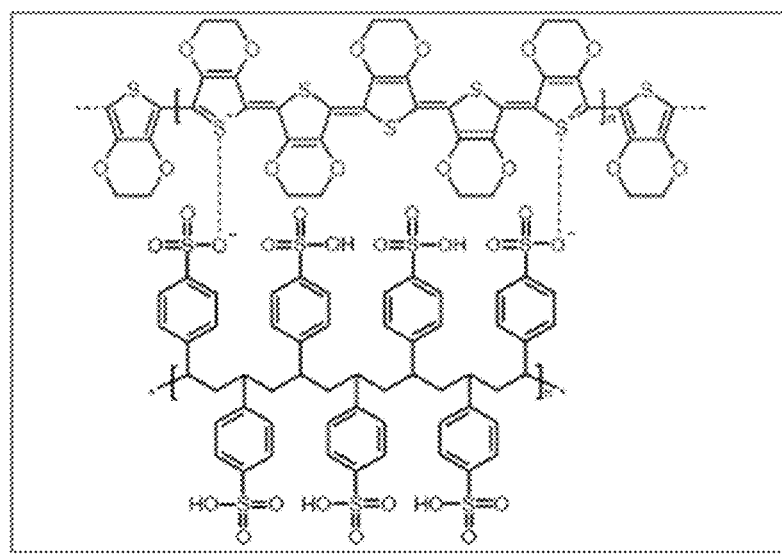
FIG. 6. The polymer Poly(3,4-ethylenedioxythiophene):Poly(styrenesulfonate); PEDOT (top) is the conducting part of the polymer backbone while PSS (bottom) is insulating.

Conducting polymers show unusual electrochemical properties such as high electrical conductivity, low ionization potential, high electronic affinities, and optical properties. Poly(3,4-ethylenedioxythiophene):poly(styrenesulfonate) (PEDOT:PSS) (FIG. 6) is a conductive polymer, has good thermal and environmental stability, and possesses good processability from an aqueous solution. Due to these properties, PEDOT:PSS shows promise in organic solar cells, organic light-emitting diodes, supercapacitors, and biosensors.

The use of PEDOT:PSS nanofibers is of particular interest in the development of radiation biosensors as the inherent conductive properties can be harnessed to make a simple signaling device. In this example, the change in PEDOT:PSS nanofiber conductivity was monitored following exposure to various amounts of gamma and x-ray irradiation.

Nanofiber Fabrication. PEDOT:PSS was combined with 4 wt % PVA to enhance fiber spinability. Electrospinning is a simple yet versatile method for forming nanofibers. An electrical force is applied to a polymeric solution and a charged jet is ejected from the tip of the syringe containing the solution. The polymer fibers are collected onto a grounded foil or transistor substrate as a nonwoven mat.

Irradiation experiments. Nanofiber conductivity was measured using 2-point and 4-point probe Silicon-Gold transistor substrates. Conductivity measurements of PVA nanofibers were taken to ensure all conductivity resulted from PEDOT:PSS.

Figure 7:
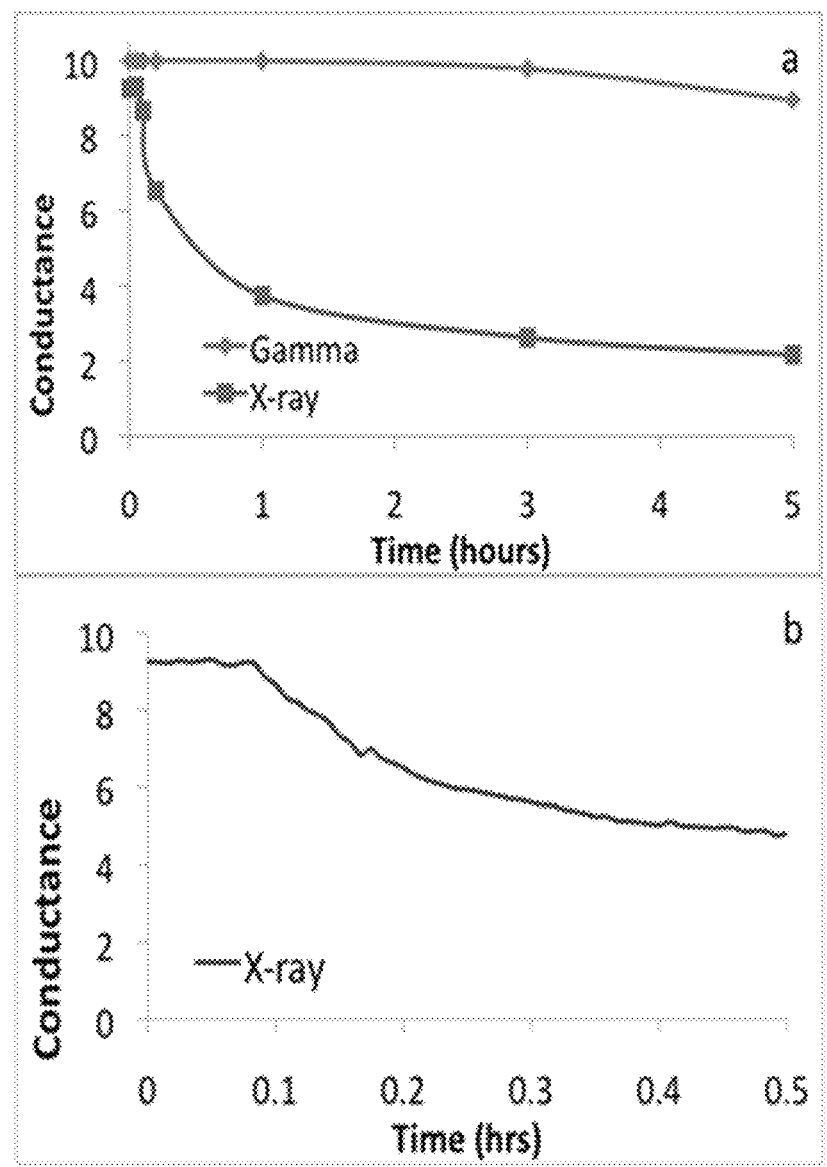
FIG. 7. The conductivity of conducting fibers exposed to (a) both Gamma and X-ray irradiation for 5 hours and (b) X-rays for 30 minutes.

PEDOT:PSS nanofibers were exposed to two types of ionizing irradiation: Gamma and X-rays. (FIG. 7). Gamma rays typically have wavelengths less than 10 picometers and energies above 100 keV. X-rays have wavelengths in the range of 0.01 to 10 nanometers and energies in the range 120 eV to 120 keV. Gamma rays have a much smaller penetration depth than X-ray and take much longer to exhibit the same decrease in conductance. Both the Gamma and X-ray irradiated fibers appear to have an induction period before conductance begins to decrease rapidly. Induction period exposure is approximately 150 Grays of ionizing radiation.

Figure 8:
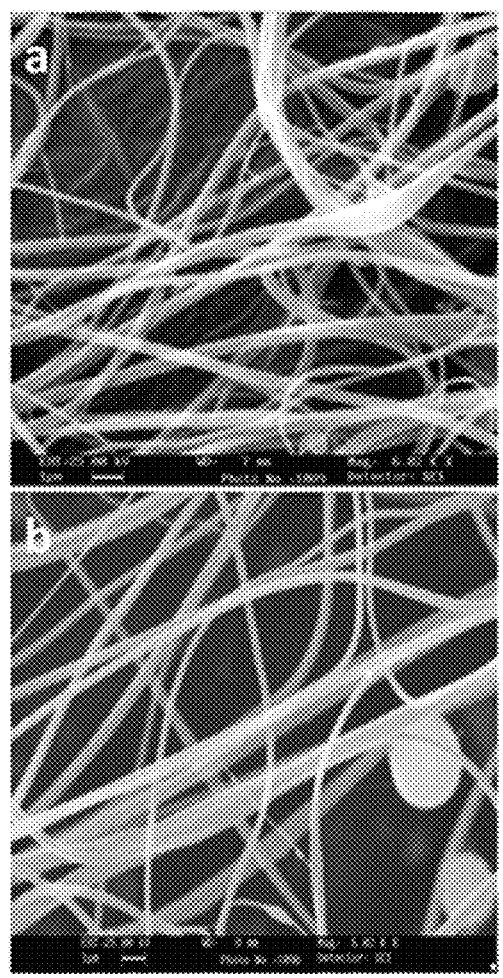
FIG. 8. SEM images of (a) non-irradiated and (b) 10 Gray Gamma irradiated conducting polymer nanofibers.

Fiber Characterization (FIG. 8). SEM images were taken after irradiation to assess any damage that Gamma or X-rays might be causing to the fibers. The fibers appear unchanged upon various levels of irradiation. This supports the idea that the changes in conductivity observed are due not to morphological changes, i.e. fibers breaking down, but to bonding and electronic differences in the PEDOT:PSS backbone.

Figure 9:
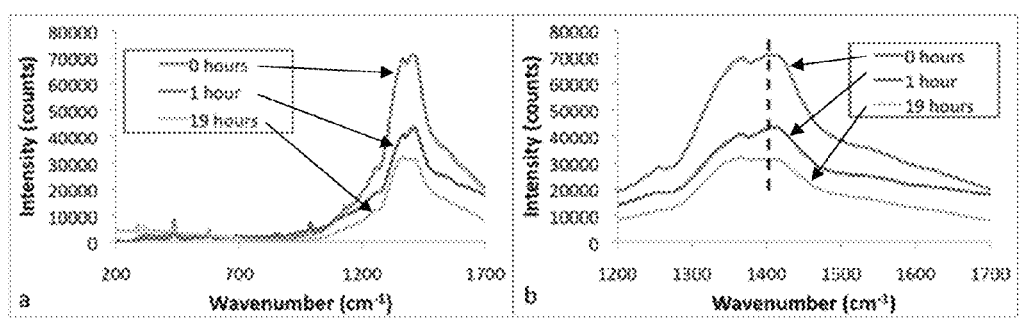
FIG. 9. (a) A full Raman spectra of irradiated conducting polymer nanofibers and (b) a spectrum of 1200-1700 cm$^{-1}$ illustrates the shift in the symmetric C$\alpha$=C$\beta$ stretch.

Spectroscopy & Mechanisms (FIG. 9). To understand the mechanism for the decrease in conductivity, irradiated and nonirradiated PEDOT:PSS fibers were probed by Raman spectroscopy. Only the peak associated with the symmetric $C_a=C_b$ stretching appears to shift by 14 cm$^{-1}$.

Figure 10:
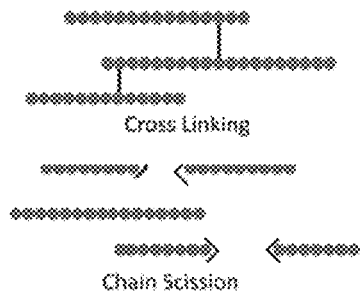
FIG. 10. Crosslinking and chain scission of polymer chains.

Two simultaneous competing mechanism for change in electrical properties in the presence of an ionizing radiation field. (FIG. 10). At low doses, cross-linking dominates, causes the induction period. At high total doses, free radical formation by chain scission dominates the kinetics of polymer degradation.

Example 4

This example describes the fabrication of conducting polymer nanofibers.

Materials. PVA (Polyvinyl alcohol): MW: 78,000, hydrolysis: 99.7% PEDOT:PSS (Aqueous Poly(3,4-ethylendioxythiophene)-poly(styrenesulfonate)), Brand name: Clevious™ PH 1000, Solid content: 1~1.3%, PEDOT:PSS ratio=1:2.5 (by weight). Triton X-100 (nonionic surfactant). One component in this mixture is made up of sodium polystyrene sulfonate which is a sulfonated polystyrene. Part of the sulfonyl groups are deprotonated and carry a negative charge. The other component poly(3,4-ethylenedioxythiophene) or PEDOT is a conjugated polymer and carries positive charges and is based on polythiophene. Together the charged macromolecules form a macromolecular salt. It is used as a conductive polymer. This compound is generally applied as a dispersion of gelled particles in water.

Preparation of Spinning Dopes

TABLE 1

| Sample name | Solution | | PVA polymers (wt %) | | Functional additive (EG or DMSO, wt %) | | Surfactant (X-100) | Remarks |
|---|---|---|---|---|---|---|---|---|
| | PEDOT:PSS | water | vs PEDOT:PSS | vs water | DMSO | EG | wt % over solution | |
| No 1 | 100% | — | — | — | — | — | — | 100% PEDOT:PSS solution |
| No 2 | 0.35 g | 1 g | — | 6 | — | — | 0.5 | high viscosity |
| No 3 | 100% | — | 3 | — | — | 20 | 0.5 | low viscosity |
| No 4 | 100% | — | 4 | — | — | 5 | 0.5 | good fiber formation |
| No 5 | 100% | — | 4 | — | 5 | — | 0.5 | good fiber formation |
| No 6 | 100% | — | 5 | — | 5 | — | 0.5 | bad fiber formation |

Figure 11:
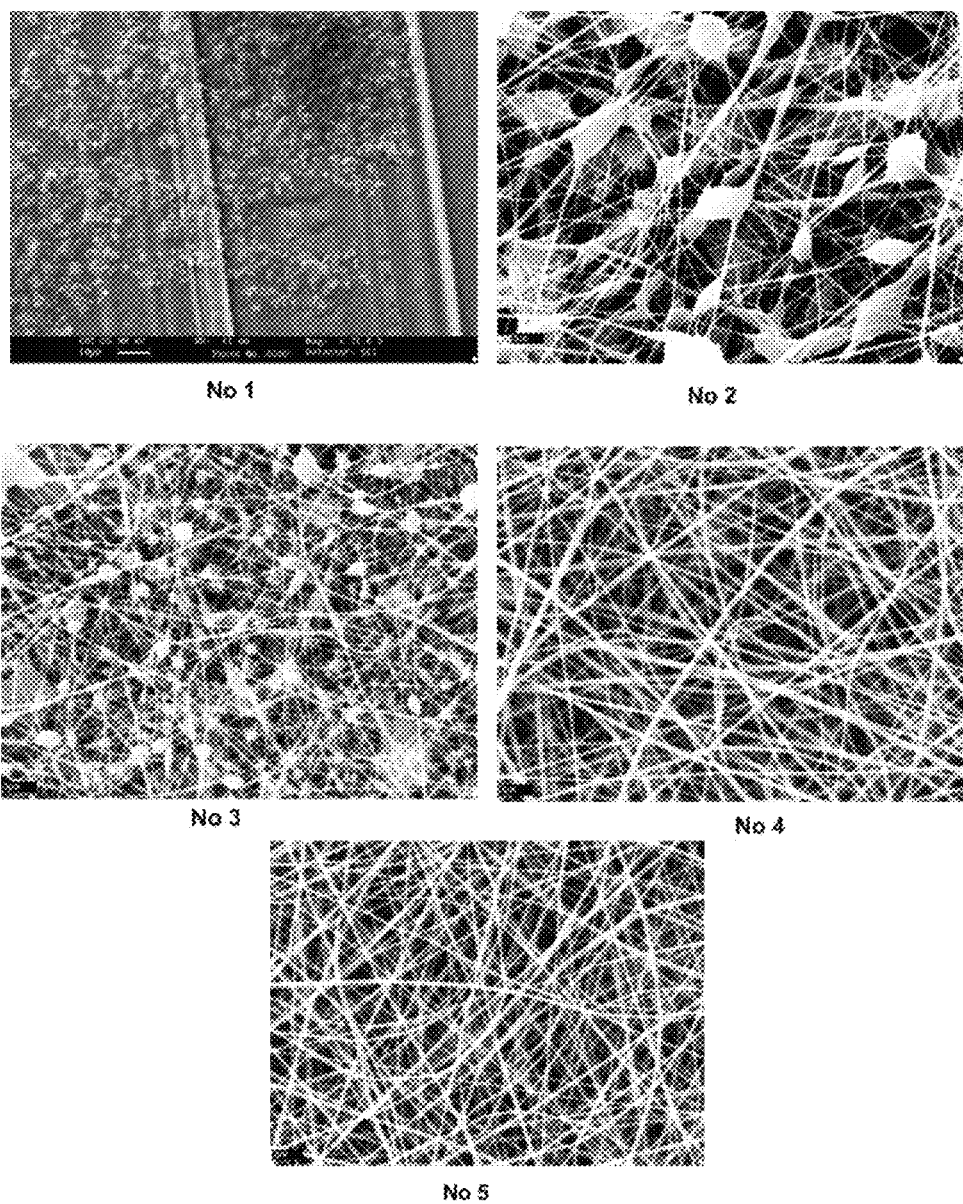
FIG. 11. SEM images of electrospun fibers using different PVA polymer concentrations in PEDOT:PSS solution (No 1.

Fiber morphology is shown in FIG. 11.
Characterization of Spun-Fibers Using XPS
Detection of Sulfur (S) from PEDOT:PSS
Sample Preparation for Conductance Measurement

TABLE 2

Preparation samples

| Item - | Area ($mm^2$) | Distance betwn two electrods (mm) | Finger type electrodes (μm) |
|---|---|---|---|
| Method 1 | Spin fibers on the area (5 $mm^2$) | Putting yarn between two electrodes (1~2 mm) | Spin fibers on the electrodes |
| Method 2 | | | |
| Method 3 | | | |

Dimension a=b=5 mm, d=1.0 μm (assumption, no pore), Spinning 10 min (FIG. 13 A)
Dimension L=1~2 mm, Diameter of yarn=2.0 μm, (from SEM image), Spinning 1 min for making yarn (FIG. 13 B)
Dimension number of finger: distance between fingers, Spinning 3, 5, 30, 60 sec. (FIG. 13 C)
Sample Preparation for Conductance Measurement
Area
Single Wire
A Few Fibers on Fingered Electrodes
Finger types of electrode having 75 pairs of fingers (150 total), each 5 mm long, a total channel width of 0.75 mm, where fingers are 15 μm wide and separated by Sum. The metal (Au on top of a thin Cr adhesion layer) is ~30 nm thick and 75 cm (2*75 fingers, 5 mm long).
Conductance Measurement
Measuring the current during the voltage sweep Conductance $(G)=1/R$ (resistance)

$R$=delta $V$/delta $I$ (Ω)

[Labview Coded Program] (FIG. 14)
Conductance Measurement
Conductance Results
Voltage sweep: −1.0~1.0

TABLE 3

Area of fiber mats

| Sample | Blank | 4 wt % PVA | | 3 wt % PVA |
|---|---|---|---|---|
| Conductance | 1.32E−11 | 4.09E−09 | 4E−08 | 2.66E−09 |
| | — | 6.53E−09 | 4.46E−08 | 1.26E−09 |
| | — | 8.46E−09 | 4.38E−08 | 5.86E−09 |
| Avg | 1.32E−11 | 6.36E−09 | 4.28E−08 | 3.26E−09 |

Voltage Sweep: −1.0~1.0

TABLE 4

Yarn formation

| Sample | 5 wt % PVA | 4 wt % PVA | 3 wt % PVA |
|---|---|---|---|
| Conductance | 6.65E−06 | 7.68E−06 | 9.55E−06 |
| | | 1.28E−06 | 1.77E−04 |
| | | 1.28E−04 | 3.07E−04 |
| | | 1.87E−06 | — |
| | | 2.20E−04 | — |
| Avg | 6.65E−06 | 7.18E−05 | 1.65E−04 |

Voltage Sweep: −0.5~0.5

TABLE 5

Fibers on fingered electrode

| | | Spinning (4 wt % PVA) | |
|---|---|---|---|
| Sample | Blank | for 3 sec | for 30 sec |
| Conductance | 1.05E−12 | 2.31E−04 | |
| | 7.97E−10 | — | 1.50E−03 |
| | 2.81E−12 | — | 1.46E−03 |

Basic Method for Conductivity (FIG. 15)

Resistivity $(\rho)=R \times d \times a/b$ [Ωcm] ($d$=thickness of fiber mats)

Conductivity=1/ρ [S/cm]

For an example, calculating conductivity of the fiber mats at a rectangle area.
In the case of 6.36E−09 conductance, Resistivity $(\rho)=R \cdot d \cdot a/b$ [Ωcm]=1.6·108 (Ω)×10-4 (cm) =1.6·104 (Ωcm)

Conductivity $(\sigma)=1/\rho$ [S/cm]=6·10-5 (S/cm) (Assumption: $d$=1.0 μm, no pore)

Semi-Conducting Organic Fibers
Difficult to calculate the conductivity due to the high porosity of fibrous membrane and uncertain thickness of the membrane
Conductivity Measurement
1. Using Electrospun Mats
No calculation, it is difficult to assume the area of the mats due to lots of pores in the fiber mats.
2. Using a Single Yarn (Fabricated During Electrospinning)
Calculating the Conductivity of the Bulky Yarn Between Two Electrodes
In the case of 7.2E−05 conductance, $L$=0.2 cm,$A$=3.8$E$-05 $cm^2$($r$=35$E$-04 cm)

$R$=1/conductance=1.4$E$+04

Resistivity (ρ)=R·A/L [Ωcm]=1.4E+04×3.8E-05/0.2
(Ωcm)=2.7 (Ωcm)

Conductivity (σ)=1/ρ [S/cm]=4~10-1 (S/cm) (Assumption: r=35 µm, no empty space among the yarn)

Higher conductivity compared to the polyaniline electrospun fibers (ref. APL, 83(20), 2003). Forming the yarn is important. Collecting fibers for about 5 min 60 RPM, 0.01 mL/min flow rate.
Conductivity Measurement
3. Using Fibers on an Electrode (SEM Image)
    calculating the conductivity of a few fibers between two electrodes
    fiber diameter: around 200 nm
Spinning for 2-5 seconds, grounded at the electrodes (FIGS. 16 A-C). Spinning for 60 seconds (FIGS. 16 D-E)
    Conductivity Measurement
3. Using Fibers on an Electrode (SEM Image)
In the case of 2.3E-04 conductance with the sample spun for 3 sec L=5E-04 cm, A=7.8E-11 cm2 (dia.=0.1 µm)

R=1/conductance=4.3E+03

Resistivity (ρ)=R·A/L [Ωcm]=4.3E+03×7.8E-11/5E-04(Ωcm)=6.7E-03(Ωcm)

Conductivity (σ)=1/ρ [S/cm]=1.5~102 (S/cm)/10 ea fiber=15 (S/cm) (Assumption: dia. of a single fiber=100 nm, ten single fibers on the electrode).

Showing good conductivity—assumption of a single fiber on the electrode
    Exposure on Xray Radiation
1. Emission of radioactivity (FIG. 17)
2. Experimental set-up (FIG. 18)
    Conditions of Xray radiation
    exposure for 25 hours
    35 kV, 50 mA of Tu source radiation
    Preparation of Two Types of Samples
    spun fibers on electrode for 60 sec
    fiber mats without/with cross-linked
Measurement of Conductance
    real time measurement (every 30 sec.)
    measuring for 25 hours
    Analysis of Conductance Reduction
    Characterization of Radiated Fibers
    Exposure on Xray Radiation
1. Radiation Results
    No cross linked fibers (FIG. 19)
    Initial conductance: 1.44e-5
    Cross linked fibers (FIG. 20)
    Initial conductance: 1.15e-4
    Exponential drop of conductance. Over 50% reduction within 1 hour.
    Exposure on Xray Radiation
1. Radiation Results (FIGS. 21-22)
Absolute conductance shows big difference between two fibers.
Retention ratio of conductance shows the same trend at the two fibers.
    Exposure on Xray Radiation
1. Characterization of radiated fibers
    SEM Images of the Fibers Before/after Radiation Exposure.
        Using bulk fiber samples before radiation and after radiation for 7 hours and 40 hours
        Before exposure (FIG. 23 A)
        For 7 hours (FIG. 23 B)
        For 25 hours (FIG. 23 C)
        No significant differences among the samples.
    Exposure on X-ray Radiation
    Characterization of Radiated Fibers
    RFIR analysis (FIG. 24)
    XRD analysis
    No differences among the samples.

Example 5

This example demonstrates the effects of organic solvents on the morphology and conductivity in PEDOT:PSS/PVA nanofibers.

The effect of solvents on the morphology and conductivity of PEDOT:PSS/PVA nanofibers was studied. Conductive PEDOT:PSS/PVA nanofibers were electrospun dissolving a fiber forming polymer (PVA) in an aqueous dispersion of PEDOT:PSS. Enhancement of the morphology and conductivity of PEDOT:PSS/PVA fibers was observed when ethylene glycol (EG) or dimethyl sulfoxide (DMSO) was added to the spinning dopes.

PEDOT:PSS cannot be electrospun alone, PVA was selected as a carrier polymer. Solvents including DMSO, EG, DMF, THF and PEG were added to the spinning dope and their effects on fiber morphology and conductivity were investigated. All electrospinning experiments were done in glovebox to control humidity (FIG. 25).

High voltage supply was used in this non-mechanical, electrostatic technique to create an electrical potential between a grounded target and the surface of the polymer solution droplet. When the applied electric force overcame the surface tension of the polymer solution, a jet was produced, and solvent molecules began to evaporate rapidly.

SEM Images Results. PEDOT:PSS nanofibers, and the nanofibers electrospun from solutions with 5 wt. % DMF and THF, showed beads and average fiber diameters between the beads were statistically equal. Addition of 5 wt % DMF or 5 wt. % THF did not affect the resulting fiber structure. Nanofibers electrospun from solutions with 5 wt. % PEG exhibited branched fiber morphology, and had higher average nanofiber diameter compared to other fibers. Due to its high molecular weight, PEG does not evaporate during electrospinning. While some fibers were formed, electrospray also occurred. For this reason, PEG is not suitable for integration into this electrospinning system. Conversely, it was found that the number of beads decreased significantly and the average fiber diameter increased when fibers were electrospun from solutions with 5 wt. % EG or DMSO. The most uniform fiber morphology was obtained by adding 5 wt. % EG to the solution. (FIG. 26).

Conductivity Results. PEDOT:PSS nanofibers with no addition of EG or DMSO have very low conductivity. However, there is a significant increase in conductivity when 5 wt. % EG or DMSO is added to the solution before electrospinning. The conductivity of PEDOT:PSS fibers is enhanced by almost 30-fold when EG is added to the spinning dopes and by 15-fold when DMSO is added to the spinning dopes. It is evident that EG is the optimum solvent to improve both conductivity and morphology of PEDOT:PSS fibers. (FIG. 27).

Raman spectroscopy and AFM Results. Raman spectroscopy showed a transition from the benzoid to the quinoid structure of PEDOT on the addition of EG or DMSO to the electrospinning dope. The benzoid structure exists in a coiled chain configuration while the quinoid structure exists in a more extended chain configuration. AFM analysis on thin films confirmed an increase in surface roughness associated with the change in PEDOT chain configuration (FIG. 28).

DSC and XRD Analysis. DSC results showed that total degree of crystallinity of the samples increased when the either EG or DMSO was added to the spinning dopes. Total melting enthalpy measured by DSC is larger than expected for pure PVA crystals alone. XRD results showed that fibers with EG or DMSO have larger and sharper peaks compared to the fibers spun with no added solvent. The increased crystallinity was consistent with the change in PEDOT structure from coiled to extended chain conformation (FIG. 29).

Crosslinking Studies. To eliminate water solubility of the PEDOT:PSS/PVA nonwoven mats, samples were exposed to vapor from an aqueous glutaraldehyde (GTA) solution to induce PVA crosslinking. Left image: before crosslinking, in response to 1 drop of water. Right image: Crosslinked fibers (exposed to vapor for 12 h and heated in oven for 12 hours) immersed in DI water for 2 days (FIG. 30).

Conclusions. In this study, adding solvents to the spinning dopes not only increases the conductivity of fibers but also improves the fiber morphology. There is up to 30 fold increase of conductivity compared to original fibers. By adding DMSO to spinning dopes, there is an improvement in fiber morphology and increase in fiber conductivity, however the best fibers resulted from introducing EG to the dopes; less beady and the most uniform. Raman spectroscopy results show that there is a change in molecular structure from benzoid to quinoid. Benzoid structure is the favored structure of coil. On the other hand, quinoid structure is the favored structure of extended coil so the change in molecular structure induces the change in chain conformation. DSC results show that the total degree of crystallinity increased when EG or DMSO added to the spinning dopes. XRD results show that the use of either EG or DMSO as solvents, enhances the crystallinity of the fibers. After adding solvents, surface roughness increased. This shows the change in chain conformation of PEDOT. Extended coil/linear conformations increase interchain interactions among the PEDOT chains and have high charge-carrier mobility. After adding solvents, surface roughness increased. DSC, XRD and AFM results prove the change in chain conformation. Water resistant fibers were obtained by crosslinking.

Example 6

Conducting polymer nanofibers of Poly(3,4-ethylenedioxythiophene):poly(styrenesulfonate)/Polyvinyl Alcohol (PEDOT:PSS/PVA) were fabricated at room temperature and via electrospinning with diameters ranging from 100 to 300 nm. The nanofibers were irradiated with Gamma and X-rays for varying lengths of time and the change in conductivity was evaluated. Raman and Electron Spin Resonance spectroscopy of X-ray irradiated nanofibers were obtained to determine the mechanism of conductivity degradation. A decrease in molecular ordering as well as chain scission via chain crosslinking and free radical formation are the two most likely mechanisms for change in conductivity. These nanofibers are promising candidates for use in highly sensitive, real-time electrically based sensor for radiation detection.

Conductive nanofibers have the potential to be used in small, cheaply made, radiation sensors but the effects of the radiation on polymer conductivity must first be thoroughly characterized and understood. This study presents preliminary characterization of PEDOT:PSS nanofibers to be used in radiation sensors. Here, the change in PEDOT:PSS nanofiber conductivity was monitoring following exposure to various amounts of gamma and x-ray irradiation. Additionally, the mechanism causing the change in conductivity between the irradiated and non-irradiated nanofibers was characterized using both microscopic and spectroscopic techniques. Microscopy was utilized to confirm that any changes in conductivity did not result from bulk physical changes such as fiber breakage. Raman and Electron Spin Resonance Spectroscopy were employed to probe the changes in bonding and the accumulation/decrease of free radicals in the structure of PEDOT, respectively.

Experimental Section. Chemicals. An aqueous dispersion of poly(3,4-ethylenedioxythiophene) doped with poly(4-styrene sulfonate) (PEDOT:PSS) was purchased by Bayer Corporation (Baytron P) and used as received. This product has 1.3 wt % of the polymer in water. Polyvinyl alcohol ($M_w$=78, 000) was supplied by Polysciences, Inc. (Warrington, Pa.). Nonionic surfactant Triton X-100 (p-tertiary-octylphenoxy polyethyl alcohol) and dimethyl sulfoxide were purchased from Sigma-Aldrich Corp. (St. Louis, Mo.). To manufacture the electrospun nanofibers, 4.0 wt % PVA polymers were first dissolved in an aqueous dispersion of PEDOT:PSS at 95° C. for six to ten hours. 5.0 wt % DMSO and 0.5 wt % X-100 were then added to the PVA solution and thoroughly mixed with a vortex for two minutes to make a homogenous spinning dope.

Nanofiber Fabrication. Electrospinning is a technically simple yet versatile method for forming submicron fibers. The elements of the electrospinning apparatus used in this example consisted of a syringe, a high voltage power supply (Gamma High Voltage Research Inc., FL), and grounded cathode (Al foil or Si—Au electrode substrate), and a syringe pump (Harvard Apparatus, MA). Approximately 3.0 mL of the prepared spinning dope was placed in the syringe and was spun from a 22 G needle at 0.54 ml/hr with an applied voltage of 15 kV. The fibers were formed on the grounded aluminum collector 15 cm from the spinneret tip. Electrospinning was maintained at room temperature and below 25% humidity.

Nanofiber Irradiation. PEDOT:PSS nanofibers were exposed to gamma irradiation with a Gammacell-40 Irradiator. The irradiator contained a cesium-137 source with a dose rate of 69 rads/min. PEDOT:PSS nanofibers were exposed to X-rays from two different sources. The fibers used for analysis via Raman and Electron Spun Resonance spectroscopy were irradiated with a rotating copper anode x-ray generator. X-rays generated from this source originated from Cu Kα electrons equivalent to approximately 8 KeV. Additionally, the Cornell High Energy Synchrotron Source (CHESS) was utilized conductance measurements of nanofibers following X-ray irradiation. The PEDOT:PSS nanofibers were irradiated with energy equal to approximately 9 KeV.

Nanofiber Conductivity. The PEDOT:PSS fibers were spun onto two kinds of electrode substrates. The first was a two-point electrode substrate of an interdigitated microelectrode array (IDMA) which consists of 75 pairs of electrode fingers, each 15 mm wide, spaced by 5 mm and 5 mm long. The second was a four-point electrode substrate of an IDMA, which consists of 75 pairs of electrode fingers, each 15 mm wide, spaced by 500 mm and 10 mm long. The electrodes were made with 35 nm Au on top of a 5 nm thick adhesion layer. The conductance of the nanofibers was measured using a two-probe or four-probe method as a voltage sweep (−0.5 to 0.5 V) was applied to the sample at a sweeping rate of 100 mV/s by a Keithley 2400 SourceMeter. Conductivity measurements of non-irradiated PEDOT:PSS nanofibers were taken using both two-point and four-point probe measurements. When measuring very small resistances, the two-point method is generally not satisfactory because contact resistance becomes significant. Instead, the four-point probe method is used because it minimizes, if not eliminates, the effect of contact resistance. In this study, there was not a statistically significant difference between using a two-point or four-point probe technique. This indicates negligible contact resistance. Additionally, control studies, which examined any conductive effect of the PVA core fibers, were carried out. It was determined that PVA does not possess any conductive properties and that any conductivity measured was solely due to the PEDOT:PSS polymer sheath.

Nanofiber Characterization. Morphology and fiber diameter for the electrospun fibers was examined using a Leica 440 scanning electron microscopy (SEM) at 30 kV with an electron backscatter detector. Samples were coated for 30 seconds with Au—Pd to prevent charge buildup. To understand the mechanism for the decrease in conductivity, irradiated and non-irradiated PEDOT:PSS fibers were probed by using a Renishaw InVia Confocal Raman microscope and a 785 nm laser source. The resulting spectra were analyzed using Wire 3.3. Electron Spin Resonance (ESR) was utilized to characterize the nature of the charge carrier responsible for conductivity. ESR spectra of fibers were recorded on a Bruker EMX ESR spectrometer at a microwave frequency of 9.861 GHz.

Results and Discussion. Irradiation of Fibers. Conductivity measurements of PEDOT:PSS nanofibers were taken on two-point probe electrical transistor both before and after irradiation experiments. PEDOT:PSS nanofibers were spun onto a clean transistor substrate for a total of 10 seconds for all samples such that the fiber mat was consistent for all measurements. The finger-shaped electrodes allowed for uni-directionality of the nanofibers, which was confirmed visually via confocal microscopy. After electrospinning the fibers, the conductance of the fibers was determined while a voltage sweep (−0.5 to 0.5 V) was applied to the sample at a sweeping rate of 100 mV/s. In order to calculate the conductivity of a single fiber, the area and fiber mat density were taken into consideration. Since fiber preparation and spinning methodology were consistent for all samples, it was assumed that the diameter of a single fiber was 500 nm and 10 single fibers were present on each electrode. These parameters were initially confirmed via SEM and confocal microscopy.

Conductivity with respect to exposure time of Gamma and X-ray irradiated PEDOT:PSS nanofibers are shown in FIG. 31. FIG. 31-A shows the change in conductivity for nanofibers up to 15 hours. Although Gamma rays exist at a higher energy and frequency than X-rays, Gamma irradiation is not as damaging as X-rays when exposed for the same length of time. This is due to the larger penetration power of X-rays. Even though the PEDOT:PSS nanofibers are only 100 nm in diameter, Gamma rays are barely able to penetrate the surface of the polymer whereas the X-rays are able to penetrate deep within the surface. As demonstrated in FIG. 31-A, it takes approximately 5 hours for the Gamma ray exposed nanofibers to exhibit a 10% decrease in conductivity whereas it takes only about 5 minutes for the X-ray exposed nanofibers to exhibit a 10% decreases. However, when the Gamma data is extended to a much longer time, these data sets appear similar. Both have an induction period in which the conductivity remains constant before decreasing. This time difference in induction period is attributed to the differences in penetration ability of Gamma and X-rays. Finally, when the conductance is plotted versus exposure dosage of irritation in Grays, as shown in FIG. 31-B, both Gamma and X-rays exhibit an identical trend in the decrease in conductivity.

Microscopy. After both gamma and x-ray irradiation, SEM images were taken to assess any damage that the irradiation might be causing to the fibers. As shown in FIG. 4, the fibers are unchanged upon various levels of irradiation. This supports the idea that the changes in conductivity observed are due not to morphological changes, i.e. fibers breaking down, but to bonding and electronic differences in the PEDOT:PSS backbone.

Two resonant structures, benzoid and quinoid configurations, have been proposed for PEDOT. These two configurations are easily distinguished via Raman spectroscopy due to the two conjugated π-electrons on the $C_\alpha=C_\beta$ bond in the benzoid structure, and no conjugated π-electrons on the $C_\alpha-C_\beta$ bond in the quinoid structure. Using Raman spectroscopy, the configuration of PEDOT has been found to correspond with the level of surface conductivity. PEDOT:PSS nanofibers in which the majority of the fibers take a benzoid configuration exhibit lower surface conductivity than nanofibers which take a quinoid configuration.

Spectroscopy. To understand the mechanism for the conductivity decreases on the molecular level, the PEDOT:PSS fibers were probed by Raman spectroscopy, a powerful tool for studying conducting polymers. Using this technique, the changes in oxidation state and chain alignments were compared via monitoring the changes in band positions of the quinoid and benzoid resonance. Raman spectra of PEDOT:PSS fibers, both before and after irradiation, were recorded between 200 and 1700 $cm^{-1}$ and are shown in FIG. 33.

Peak assignments based on previous reports were used and peaks were observed at 1530 $cm^{-1}$ (asymmetric C=C stretch), 1426 $cm^{-1}$ (symmetric $C_\alpha=C_\beta$ stretch), 1366 $cm^{-1}$ ($C_\beta-C_\beta$ stretch) and 1257 $cm^{-1}$ ($C_\alpha-C_{\alpha'}$ stretch). Irradiation, which resulted in significant decreases in conductivity, resulted in a shift in the high-frequency Raman band (centered at 1426 $cm^{-1}$) associated with the symmetric $C_\alpha=C_\beta$ stretching from the thiophene rings by 14 $cm^{-1}$. This shift is attributed to the benzoid rather than quinoid resonance structure that is characteristic of a less conducting form of PEDOT. The curve fitting analysis of the three Raman spectra is presented in FIG. 34. Here, it is seen that only the peak associated with the symmetric $C_\alpha=C_\beta$ stretching shifts. The $C_\alpha=C_\beta$ bond is thus the source of polymer deformation and loss of conductivity upon irradiation.

To probe the differences in conductivity as well as charge carrier mobility, electron spin resonance (ESR) spectroscopy was utilized to characterize the nature of the charge carrier (polaron or bipolaron) responsible for conductivity in the PEDOT:PSS fibers. As shown in FIG. 35, the ESR spectra of PEDOT:PSS exhibits no hyperfine structures which is concurrent with delocalized free radicals found in conducting polymer systems.

Additionally, a g factor of 2.0 observed for the samples is typical of free non-spin-paired electrons delocalized across the conjugated π-system. There is also a relatively broad ESR spectrum for all fiber samples, which is indicative of a higher degree of charge delocalization across the conjugated PEDOT backbone. Upon irradiation, a population and evolution of the zero-spin bibolaron (s=0) to the non-spin paired polaron (s=1/2) develops as the conductivity of the fibers decreases. This gives a sharp peak with a line width of 3.6 G and shows that upon irradiation, there is a decrease in charge delocalization as well as less molecular orientation in the polymer structure.

Mechanisms for Conductivity. Current literature on polymer exposure to irradiation suggests two simultaneous mechanisms initiated by the presence of an ionizing radiation field: chain scission and cross-linking. Chain scission causes free radical formation along the polymer backbone while cross-linking occurs when free radicals recombine and reform the electrical pathway through the fiber. When cross-linking dominates, the relative surface area of the polymer fiber actually increases as polymer strands link together. These two mechanisms can be applied to FIG. 31 and the decrease in conductivity of PEDOT:PSS nanofibers. The initial latent period in the decrease of conductivity of irradiated PEDOT:PSS samples can be attributed to an initial rate of cross-linking being greater than the rate of chain scission. When the nanofibers are irradiated for an extended period, in this study more than 150 Grays, free radical formation dominates and the rate of chain scission overtakes that of cross-linking, thus causing a decrease in surface conductivity.

We have determined the structural and electronic effects of Gamma and X-ray irradiation on PEDOT:PSS nanofibers and the subsequent observed decrease in surface conductivity. Due to differences in the penetration powers, fibers exposed to X-rays exhibit a much faster change in conductivity than fibers exposed to Gamma irradiation. Both kinds of irradiation exhibit a latent period in which polymer cross-linking is the dominating mechanism before the rate of chain-scission increases and causes the fiber conductivity to sharply decrease. The decrease in of the molecular ordering of PEDOT chains, confirmed by Raman spectroscopy demonstrates a breakdown in the intrachain interactions leading to the favoring of polaron formation, as confirmed by ESR.

While the invention has been particularly shown and described with reference to specific embodiments (some of which are preferred embodiments), it should be understood by those having skill in the art that various changes in form and detail may be made therein without departing from the spirit and scope of the present invention as disclosed herein.

What is claimed is:

1. A method for making a conducting polymer nanofiber or plurality of nanofibers comprising the steps of:
   a) providing a spinning dope comprising:
      a non-conducting polymer, wherein the non-conducting polymer is present at 0.5% by weight to 8% by weight,
      a conducting polymer,
      an organic solvent, wherein the organic solvent is dimethylsulfoxide, acetonitrile, ethylene glycol, propylene glycol, or a combination thereof and is present at 2.5% by weight to 7.5% by weight,
      water,
      a nonionic surfactant, and
      optionally, a cross-linking agent; and
   b) processing the spinning dope such that the conducting polymer nanofiber or plurality of conducting polymer nanofibers are formed.

2. The method of claim 1, wherein the non-conducting polymer is selected from poly(vinyl alcohol), poly(ethylene oxide), poly(acrylic acid), and combinations thereof.

3. The method of claim 1, wherein the conducting polymer is selected from poly(3,4-ethylenedioxythiophene), poly(fluorene)s, polyphenylenes, polypyrenes, polyazulenes, polynaphthalenes, poly(pyrrole)s (PPYs), polycarbazoles, polyindoles, polyazepines, polyanilines (PANIs), poly(thiophene)s (PTs), poly(p-phenylene sulfide) (PPSs), poly(acetylene)s (PACs), poly(p-phenylene vinylene) (PPV), and combinations thereof.

4. The method of claim 1, wherein the nonionic surfactant is an alcohol ethoxylate, alkylphenol ethoxylate, ethylene oxide/propylene oxide block copolymer, alkylpolyglycoside, alkyl N-methylglucamide, amine oxide, alkanolamide, amine ethoxylate, methyl ester ethoxylate, or a combination thereof.

5. The method of claim 1, wherein the cross-linking agent is a bifunctional cross-linking agent comprising hydroxy moieties, amine moieties, aldehyde moieties, acid moieties, cyanate moieties, isocyanate moieties, sulfonate moieties, urea moieties, or a combination thereof.

6. The method of claim 5, where in the cross-linking agent is glutaraldehyde.

7. The method of claim 1, wherein the spinning dope further comprises a surface-functionalizing polymer selected from poly(methyl vinyl ether-alt-maleic anhydride), 1,5-dimethyl-1,5-diazaundecamethylene polymethobromide and/or hexadimethrine bromide, polystyrene8K-block-poly(ethylene-ran-butylene)25K-block-polyisoprene10K (PS8K-b-P(E/B)25K-b-PI10K) grafted with $C_{18}H_{37}(OCH_2CH_2)_nOH$, where n is 10, or a combination thereof, and the conducting polymer nanofiber or conducting polymer nanofibers are surface functionalized.

8. The method of claim 1, further comprising the step of subjecting the conducting polymer nanofiber or plurality of conducting polymer nanofibers to a surface-functionalizing plasma process.

9. The method of claim 1, further comprising the step of subjecting the conducting polymer nanofiber or conducting polymer nanofibers to a layer-by-layer process, such that a surface-functionalized conducting polymer nanofiber or plurality of surface-functionalized conducting polymer nanofibers is formed.

10. The method of claim 1, wherein the processing of the spinning dope is an electrospinning process, a force spinning process, or centrifugal spinning process.

* * * * *